United States Patent
Park et al.

(10) Patent No.: US 9,343,672 B2
(45) Date of Patent: May 17, 2016

(54) NONVOLATILE MEMORY DEVICES, NONVOLATILE MEMORY CELLS AND METHODS OF MANUFACTURING NONVOLATILE MEMORY DEVICES

(75) Inventors: Chan-Jin Park, Yongin-si (KR);
Sun-Jung Kim, Yongin-si (KR);
Soon-Oh Park, Suwon-si (KR);
Hyun-Su Ju, Hwaseong-si (KR);
Soo-Doo Chae, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 105 days.

(21) Appl. No.: 13/442,595

(22) Filed: Apr. 9, 2012

(65) Prior Publication Data
US 2012/0313066 A1 Dec. 13, 2012

(30) Foreign Application Priority Data

Jun. 7, 2011 (KR) .................. 10-2011-0054706
Dec. 29, 2011 (KR) .................. 10-2011-0146159

(51) Int. Cl.
*H01L 45/00* (2006.01)
*H01L 27/24* (2006.01)

(52) U.S. Cl.
CPC .......... *H01L 45/1253* (2013.01); *H01L 27/249* (2013.01); *H01L 27/2472* (2013.01); *H01L 45/04* (2013.01); *H01L 45/1226* (2013.01); *H01L 45/146* (2013.01)

(58) Field of Classification Search
None
See application file for complete search history.

(56) References Cited

U.S. PATENT DOCUMENTS

2005/0006681 A1* 1/2005 Okuno .................... H01L 45/06
257/295
2009/0121208 A1* 5/2009 Nagashima .......... H01L 27/101
257/2

(Continued)

FOREIGN PATENT DOCUMENTS

JP 2008-277543 11/2008
KR 2009-0055874 A 6/2009

(Continued)

OTHER PUBLICATIONS

Mitchell et al., "The Work Functions of Copper, silver and Aluminum", Dec. 7, 1951, The Royal Society vol. 210, No. 1100, pp. 70-84.*

(Continued)

*Primary Examiner* — Steven Loke
*Assistant Examiner* — Juanita Rhodes
(74) *Attorney, Agent, or Firm* — Harness, Dickey & Pierce, P.L.C.

(57) ABSTRACT

A nonvolatile memory cell includes first and second interlayer insulating films which are separated from each other and are stacked sequentially, a first electrode which penetrates the first interlayer insulating film and the second interlayer insulating film, a resistance change film which is formed along a side surface of the first electrode and extends parallel to the first electrode, and a second electrode which is formed between the first interlayer insulating film and the second interlayer insulating film. The second electrode includes a conductive film which is made of metal and a diffusion preventing film which prevents diffusion of a conductive material contained in the conductive film.

31 Claims, 29 Drawing Sheets

(56) References Cited

U.S. PATENT DOCUMENTS

| | | | |
|---|---|---|---|
| 2009/0230512 A1* | 9/2009 | Baek | H01L 27/249 257/536 |
| 2009/0321878 A1* | 12/2009 | Koo | H01L 27/101 257/536 |
| 2010/0117047 A1* | 5/2010 | Tanaka | G11C 13/003 257/3 |
| 2010/0200906 A1* | 8/2010 | Kidoh | H01L 27/11578 257/324 |
| 2010/0207093 A1* | 8/2010 | Inoue | H01L 21/76807 257/4 |
| 2010/0295012 A1* | 11/2010 | Mikawa | G11C 13/0007 257/4 |
| 2010/0320526 A1* | 12/2010 | Kidoh | H01L 23/522 257/324 |
| 2011/0115049 A1* | 5/2011 | Kim | H01L 45/04 257/530 |
| 2011/0309322 A1* | 12/2011 | Hwang | G11C 13/0007 257/5 |

FOREIGN PATENT DOCUMENTS

| | | | | |
|---|---|---|---|---|
| KR | 2010-0137155 A | 12/2010 | | |
| WO | WO 2010101340 A1 * | 9/2010 | | G11C 13/0007 |

OTHER PUBLICATIONS

Han et al., "Functional Metal Oxide Nanostructrues", Sep. 22, 2011, Springer Series in Materials Science, vol. 149, DOI 10.1007/978-1-4419-9931-3_11, pp. 241-268.*

Han et al. (Functional Metal Oxide Nanostructures, Sep. 22, 2011, Springer Series in Materials Science 149, DOI 10.1007/978-1-4419-9931-3_11, © Springer Science + Business Media, LLC 2012, Table11.1.*

Han et al., One-Dimensional Oxygen-Deficient Metal Oxides, 2012, Springer Science + Business Media LLC, Functional Metal Oxide Nanostructures, Springer Series in Materials Science 149.*

* cited by examiner

NONVOLATILE MEMORY DEVICES, NONVOLATILE MEMORY CELLS AND METHODS OF MANUFACTURING NONVOLATILE MEMORY DEVICES

CROSS-REFERENCE TO RELATED APPLICATIONS

This application claims priority under U.S.C. §119 to Korean Patent Application No. 10-2011-0146159 filed on Dec. 29, 2011 in the Korean Intellectual Property Office (KIPO), which claims priority to Korean Patent Application No. 10-2011-0054706 filed on Jun. 7, 2011, in the Korean Intellectual Property Office (KIPO), the entire contents of each of which are incorporated herein by reference.

BACKGROUND

1. Field of the Invention

Example embodiments relate to nonvolatile memory cells and nonvolatile memory devices including the same.

2. Description of the Related Art

Semiconductor memory devices are memory devices implemented using a semiconductor, such as Si, Ge, GaAs, or InP. Semiconductor memory devices are classified as volatile memory devices or nonvolatile memory devices.

A volatile memory device loses stored data when the power supply is interrupted. Examples of the volatile memory devices include static random access memory (SRAM) devices, dynamic random access memory (DRAM) devices, and synchronous dynamic random access memory (SDRAM) devices. A nonvolatile memory device retains stored data even when the power supply is interrupted. Examples of nonvolatile memory devices include read-only memory (ROM) devices, programmable read-only memory (PROM) devices, erasable programmable read-only memory (EPROM) devices, electrically erasable programmable read-only memory (EEPROM) devices, flash memory devices, and resistive memory devices (e.g., phase-change random access memory (PRAM) devices, ferroelectric random access memory (FRAM) devices, and resistive random access memory (RRAM) devices).

SUMMARY

Example embodiments may provide nonvolatile memory cells with increased integration density. Other example embodiments may provide nonvolatile memory devices with increased integration density. Still other example embodiments may provide methods of manufacturing nonvolatile memory devices with increased integration density.

According to example embodiments, a nonvolatile memory cell includes first and second interlayer insulating films which are separated from each other and are stacked sequentially, a first electrode which penetrates the first interlayer insulating film and the second interlayer insulating film, a resistance change film which is formed along a side surface of the first electrode and extends parallel to the first electrode, and a second electrode which is formed between the first interlayer insulating film and the second interlayer insulating film. The second electrode includes a conductive film which is made of metal and a diffusion preventing film which prevents diffusion of a conductive material contained in the conductive film.

According to other example embodiments, a nonvolatile memory cell includes first and second interlayer insulating films which are separated from each other and are stacked sequentially, a first electrode which penetrates the first interlayer insulating film and the second interlayer insulating film, a resistance change film which is formed along a side surface of the first electrode and extends parallel to the first electrode, and a second electrode which is formed between the first interlayer insulating film and the second interlayer insulating film. At least one of the first electrode and the second electrode includes a conductive film which is made of metal, each of the first electrode and the second electrode has a work function of 4.0 to 6 eV, and the resistance change film is a metal oxide film having N-type semiconductor characteristics by a lack of oxygen.

According to still other example embodiments, a nonvolatile memory device includes a first interlayer insulating film in which a bit line and a bit line contact are formed, a plurality of second interlayer insulating films and a first electrode which are stacked alternately on the first interlayer insulating film, a second electrode which penetrates the second interlayer insulating films and the first electrode and contacts the bit line contact, and a resistance change film which is formed along a side surface of the second electrode and extends parallel to the second electrode. At least one of the first electrode and the second electrode includes a conductive film which is made of metal.

According to yet other example embodiments, a method of manufacturing a nonvolatile memory device includes sequentially forming a first interlayer insulating film, a sacrificial film, and a second interlayer insulating film, forming a resistance change film and a first electrode which penetrate the first interlayer insulating film, the sacrificial film, and the second interlayer insulating film, forming an isolation trench which exposes a side surface of the sacrificial film by etching the first interlayer insulating film, the sacrificial film, and the second interlayer insulating film, forming an electrode trench which exposes a side surface of the resistance change film by etching the sacrificial film, and forming a second electrode by forming a conductive film, which is made of metal, in the electrode trench.

According to further example embodiments, a nonvolatile memory device includes a plurality of first interlayer insulating films and a plurality of first electrodes which are stacked alternately, a plurality of second electrodes which penetrate the first interlayer insulating films and the first electrodes, and a plurality of resistance change films which are formed along side surfaces of the second electrodes to directly contact the first electrodes and the second electrodes and extend parallel to the second electrodes. At least one of each of the first electrodes and each of the second electrodes includes a conductive film which is made of metal, the first electrodes, the second electrodes and the resistance change films define n nonvolatile memory cells, and a voltage-current curve representing a current flowing through a resistance change film included in each of the nonvolatile memory cells according to a voltage applied to each of the nonvolatile memory cells includes a first section in which an inhibit current flows through the resistance change film in response to an inhibit voltage applied to each of the nonvolatile memory cells and in which resistance of the resistance change film remains unchanged and a second section in which a switching current flows through the resistance change film in response to a switching voltage applied to each of the nonvolatile memory cells and in which the resistance of the resistance change film changes. The switching current and the inhibit current satisfy, inhibit current x (n−1)<switching current, where n≥2, and n is a natural number.

According to at least one example embodiment, a nonvolatile memory cell includes a first interlayer insulating film, a second interlayer insulating films on the first interlayer film, a first electrode penetrating the first interlayer insulating film and the second interlayer insulating film, a resistance change film on a side surface of the first electrode and extending in parallel to the first electrode, and a second electrode between the first interlayer insulating film and the second interlayer insulating film, the second electrode including a first conductive film and a first diffusion barrier film configured as a diffusion barrier to a first conductive material contained in the first conductive film, the first conductive film including a first metal.

According to at least one example embodiment, a nonvolatile memory cell includes a first interlayer insulating film, a second interlayer insulating film stacked on and separated from the first interlayer insulating film, a first electrode penetrating the first interlayer insulating film and the second interlayer insulating film, a resistance change film on a side surface of the first electrode and extending in parallel with the first electrode, a material of the resistance change film including an oxygen deficient N-type semiconductor metal oxide; and a second electrode between the first interlayer insulating film and the second interlayer insulating film, at least one of the first electrode and the second electrode including a first conductive film, a first conductive material of the first conductive film including a metal, a work function of each of the first electrode and the second electrode being about 4.0 to 6.0 eV.

According to at least one example embodiment, a nonvolatile memory device includes a first interlayer insulating film, a bit line and a bit line contact in the first interlayer insulating film, a plurality of second interlayer insulating films and a first electrode on the first interlayer insulating film, a second electrode penetrating the second interlayer insulating films and the first electrode, the second electrode contacting the bit line contact, at least one of the first electrode and the second electrode including a first conductive film containing a first metal, and a resistance change film extending on a side surface of the second electrode and in parallel with the second electrode.

According to at least one example embodiment, a method of manufacturing a nonvolatile memory device includes sequentially forming a first interlayer insulating film, a sacrificial film, and a second interlayer insulating film, forming a resistance change film and a first electrode, the resistance change film and the first electrode penetrating the first interlayer insulating film, the sacrificial film, and the second interlayer insulating film, forming an isolation trench exposing a side surface of the sacrificial film by etching the first interlayer insulating film, the sacrificial film, and the second interlayer insulating film, forming an electrode trench exposing a side surface of the resistance change film by etching the sacrificial film, and forming a second electrode by forming a first conductive film including a first conductive material in the electrode trench, the first conductive material including a first metal.

According to at least one example embodiment, a nonvolatile memory device includes a plurality of first interlayer insulating films and a plurality of first electrodes, the first electrodes alternately stacked with the first interlayer insulating films, a plurality of second electrodes penetrating the first interlayer insulating films and the first electrodes, at least one of each of the first electrodes and each of the second electrodes including a conductive film made of metal, and a plurality of resistance change films on side surfaces of the second electrodes and directly contacting the first electrodes and the second electrodes, the resistance change films extending in parallel to the second electrodes. The first electrodes, the second electrodes and the resistance change films are part of n nonvolatile memory cells, and the resistance change films in each of the cells include a resistance change material, a voltage-current characteristic of the resistance change material including, a first voltage range corresponding to an inhibit current, the inhibit current a function of inhibit voltage applied to the resistance change material, a resistance of the resistance change material remaining about unchanged in the first voltage range, and a second voltage range corresponding to a switching current, the switching current a function of switching voltage applied to the resistance change material, a resistance of the resistance change material changing in the second voltage range, and the switching current and the inhibit current satisfy inhibit current x (n−1)<switching current, where n≥2, and n is a natural number.

According to at least one example embodiment, a nonvolatile memory device includes a first memory cell including, a first electrode including a first metal, a second electrode, and a resistance change film in contact with the first and second electrodes.

BRIEF DESCRIPTION OF THE DRAWINGS

Example embodiments will be more clearly understood from the following brief description taken in conjunction with the accompanying drawings.

FIG. 1 is a conceptual perspective diagram illustrating nonvolatile memory devices according to at least one example embodiment;

FIG. 2 is a perspective diagram illustrating a memory block of FIG. 1;

FIG. 3 is a cross-sectional diagram taken along the line III-III' of FIG. 2;

FIG. 4 is an enlarged cross-sectional diagram illustrating a region TS1 of FIG. 3;

FIGS. 5-7 are enlarged cross-sectional diagrams of nonvolatile memory cells according to some example embodiments;

FIG. 8 is a graph of current as a function of voltage illustrating device characteristics of nonvolatile memory cells according to example embodiments;

FIG. 9 is a perspective diagram illustrating nonvolatile memory devices according to other example embodiments;

FIG. 10 is a cross-sectional diagram taken along the line X-X' of FIG. 9;

FIG. 11 is an enlarged cross-sectional diagram illustrating a region TS5 of FIG. 10;

FIG. 12 is a flowchart illustrating methods of manufacturing nonvolatile memory devices according to still other example embodiments;

FIGS. 13-18 are perspective diagrams illustrating intermediate processes in the manufacturing method of FIG. 12;

FIG. 19 is a flowchart illustrating methods of manufacturing nonvolatile memory devices according to yet other example embodiments;

FIGS. 20-27 are perspective diagrams illustrating intermediate processes in the manufacturing method of FIG. 19;

FIG. 28 is a block diagram illustrating memory systems according to some example embodiments;

FIG. 29 is a block diagram illustrating application examples of the memory systems of FIG. 28;

FIG. 30 is a block diagram illustrating computing systems including memory systems of FIG. 29; and FIGS. 31 and 32 are circuit diagrams illustrating memory cell arrays including nonvolatile memory cells according to example embodiments.

DETAILED DESCRIPTION

Figure 1:
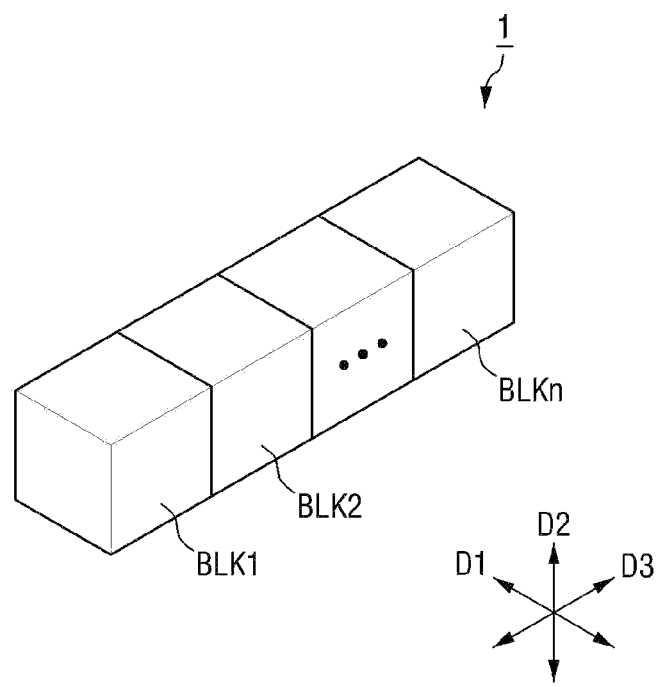
FIGS. 1-32 represent non-limiting, example embodiments as described herein.

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. Hereinafter, a non-volatile memory cell and a nonvolatile memory device including the same according to an example embodiment will be described with reference to FIGS. 1 through 4.

Figure 2:
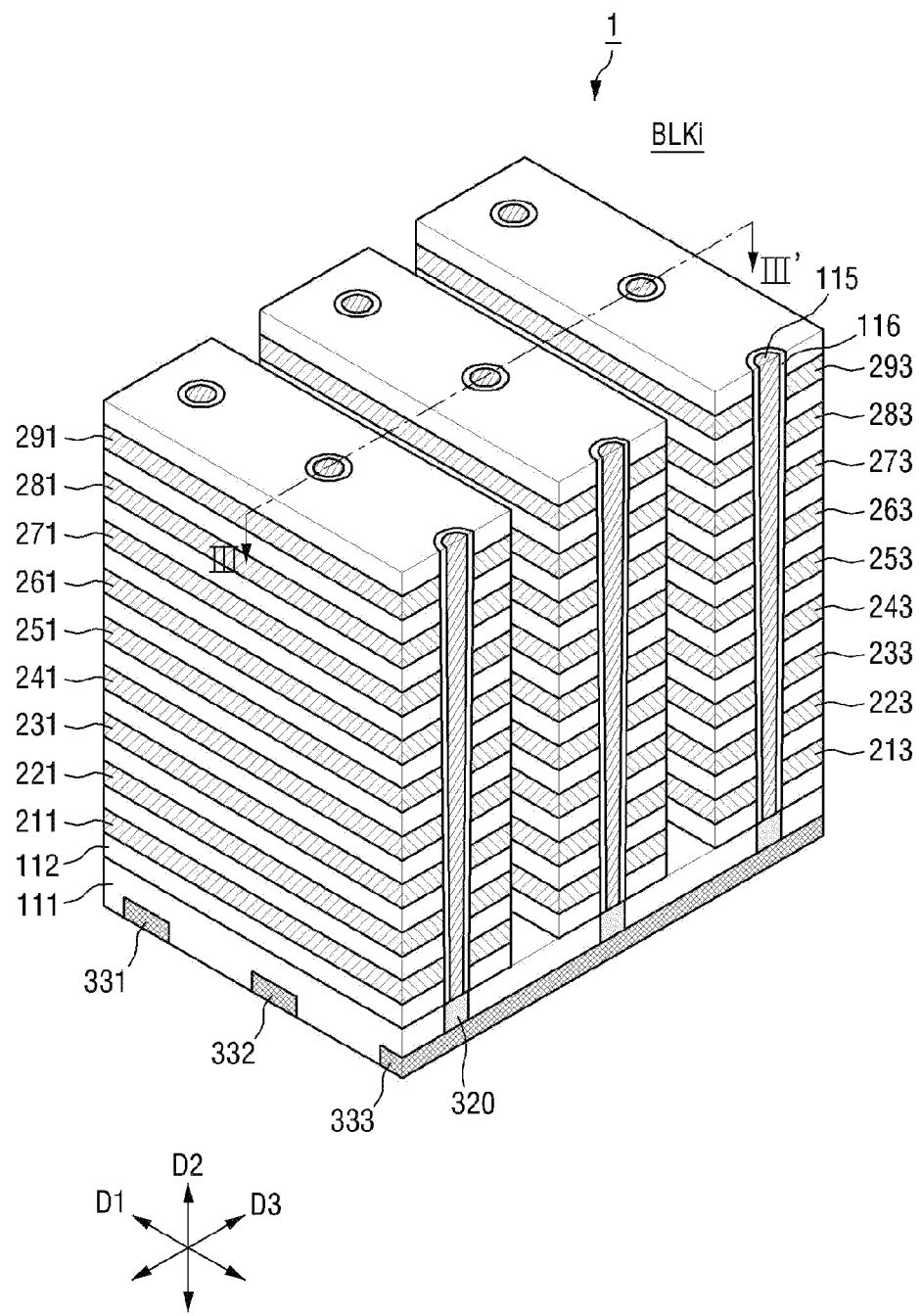
Figure 3:
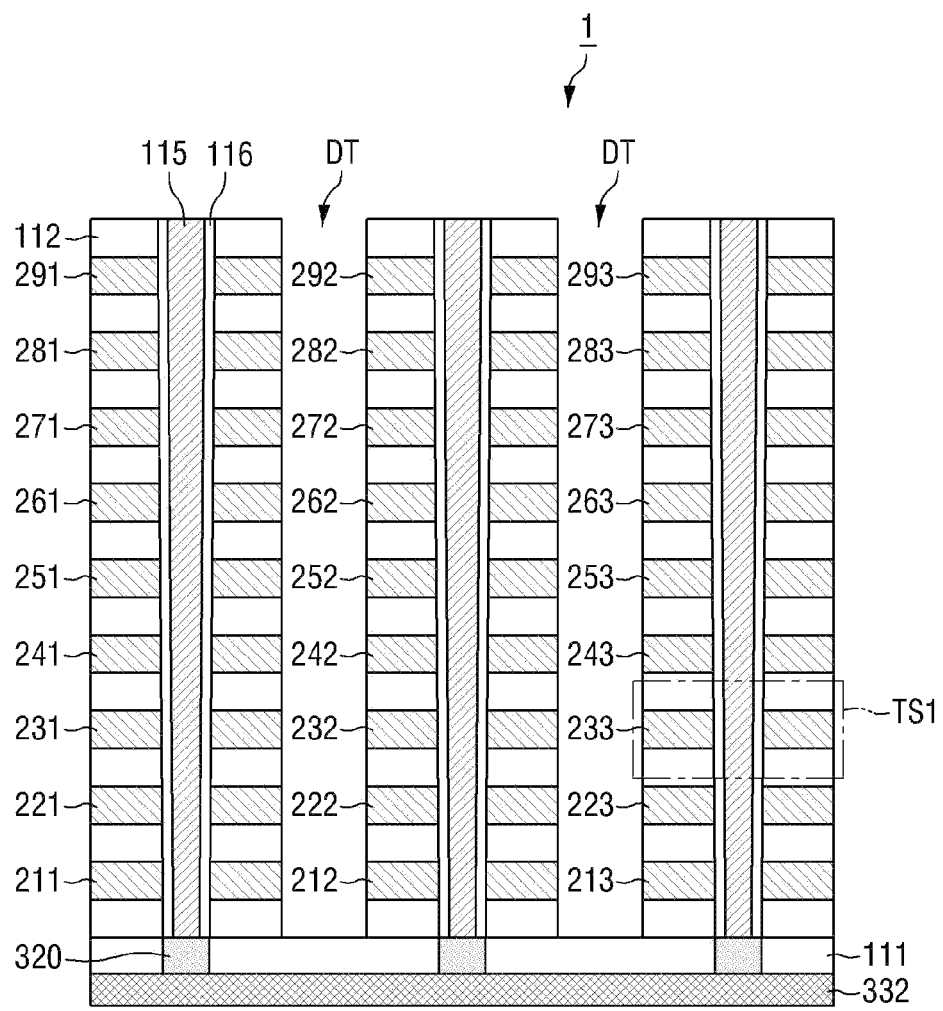
Figure 4:
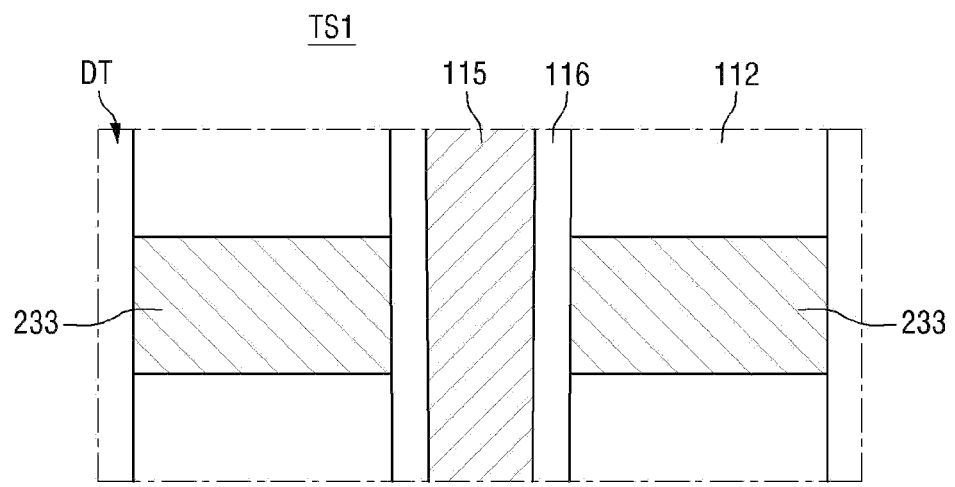

FIG. 1 is a conceptual perspective diagram illustrating nonvolatile memory devices according to at least one example embodiment. FIG. 2 is a perspective diagram illustrating a memory block of FIG. 1. FIG. 3 is a cross-sectional diagram taken along the line III-III' of FIG. 2. FIG. 4 is an enlarged cross-sectional diagram illustrating a region TS1 of FIG. 3 Referring to FIG. 1, a memory cell array of a nonvolatile memory device 1 according to at least one example embodiment may include a plurality of memory blocks BLK1-BLKn, where n may be a natural number. Each of the memory blocks BLK1-BLKn may extend in first through third directions D1-D3. The first through third directions D1-D3 may be directions that intersect each other or directions that may be different from each other. For example, the first through third directions D1-D3 may be, but are not limited to, directions that intersect each other at right angles.

Referring to FIGS. 2-4, a memory block BLKi (1≤i≤n, where i is a natural number) may include a plurality of interlayer insulating films 112, a plurality of first electrodes 115, a plurality of second electrodes 211-291, 212-292 and 213-293, and a plurality of resistance change films 116 that may be on a first interlayer insulating film 111. Bit lines 331-333 and bit line contacts 320 may be in the first interlayer insulating film 111. The bit lines 331-333 may be separated from each other and may extend in the third direction D3. The bit line contacts 320 may be electrically connected to the bit lines 331-333 and may be exposed by the first interlayer insulating film 111.

In FIGS. 2 and 3, the bit lines 331-333 may be separated from the bit line contacts 320. However, the present invention is not limited thereto. The bit lines 331-333 and the bit line contacts 320 may not be separated but may be integrated. In FIGS. 2 and 3, the first interlayer insulating film 111 and the bit lines 331-333 and the bit line contacts 320 may be under the second interlayer insulating films 112 and the second electrodes 211-291, 212-292 and 213-293. However, the present invention is not limited thereto. For example, the first interlayer insulating film 111 in which the bit lines 331-333 and the bit line contacts 320 are included may be on the second interlayer insulating films 112 and the second electrodes 211-291, 212-292 and 213-293.

The second interlayer insulating films 112 may be separated from each other in the second direction D2 and may be sequentially stacked on the first interlayer insulating film 111 in the second direction D2. Each of the second interlayer insulating films 112 may extend in the first direction D1. The first electrodes 115 may extend in the second direction D2, and the second electrodes 211-291, 212-292 and 213-293 may extend in the first direction D1. The first electrodes 115 may be on the first interlayer insulating film 111 in the form of pillars. The first electrodes 115 may penetrate the stacked second interlayer insulating films 112 and the second electrodes 211-291, 212-292 and 213-293 and contact the bit line contacts 320. The second electrodes 211-291, 212-292 and 213-293 may be between the stacked second interlayer insulating films 112. The second electrodes 211-291, 212-292 and 213-293 may intersect the first electrodes 115.

Referring to FIGS. 2 and 3, the first electrodes 115 may be separated from each other in the first direction D1 and the third direction D3. The first electrodes 115 may be in a matrix. In the drawings, the first electrodes 115 may be in a 3×3 matrix. However, the present invention is not limited thereto. An isolation trench DT may be in the second interlayer insulating films 112 between the first electrodes 115 in the third direction D3. Side surfaces of each group of the second electrodes 211-291, 212-292 or 213-293 which may be exposed by the isolation trench DT may be aligned with side surfaces of a corresponding group of the second interlayer insulating films 112 which may be exposed by the isolation trench DT.

The first electrodes 115 in the third direction D3 may be electrically connected to each other by the bit lines 331-333. The first electrodes 115 in the third direction D3 may share the bit lines 331-333. The second electrodes 221-291, 222-292 and 223-293 in the second direction D2 may share the first electrodes 115 and the resistance change films 116. Each of the first electrodes 115 may include a conductive film, for example, metal. Examples of metal included in the first electrodes 115 may be, but not limited to, Ru, RuOx, TiN, Wn, W, Al, Cu, and an alloy of these materials. Each of the second electrodes 221-291, 222-292 and 223-293 may include a conductive film, for example, metal. Examples of the metal that forms the second electrodes 221-291, 222-292 and 223-293 may include, but not limited to, Ru, RuOx, TiN, Wn, W, Al, Cu, and an alloy of these materials.

In some example embodiments, the first electrodes 115 and the second electrodes 211-291, 212-292 and 213-293 may be metal electrodes made of the same metal. In some other example embodiments, the first electrodes 115 and the second electrodes 211-291, 212-292 and 213-293 may be metal electrodes made of different metals. Each of the resistance change films 116 may be between a corresponding one of the first electrodes 115 and a corresponding group of the second electrodes 211-291, 212-292 or 213-293. The resistance change films 116 may extend parallel to the first electrodes 115 in the second direction D2, along side surfaces of the first electrodes 115.

The resistance change films 116 may be, for example, transition metal oxide (TMO). According to at least one example embodiment, the TMO may be, but is not limited to, HfOx, TiOx, TaOx, ZnO, $Ti_2O$, $Nb_2O_5$, $ZrO_2$, and/or NiO. In regions in which the first electrodes 115 may intersect the second electrodes 211-291, 212-292 and 213-293, a plurality of nonvolatile memory cells TS1 may be defined. Referring to FIG. 4, a nonvolatile memory cell TS1 according to at least one example embodiment may include a plurality of second interlayer insulating films 112 which may be separated from each other and may be stacked sequentially, a first electrode 115 and a resistance change film 116 which may penetrate the second interlayer insulating films 112, and a second electrode 233 which may be between the second interlayer insulating films 112. The shapes of the first electrode 115 and the second electrode 233 that may constitute the nonvolatile memory cell TS1 may be changed as desired.

Figure 5:
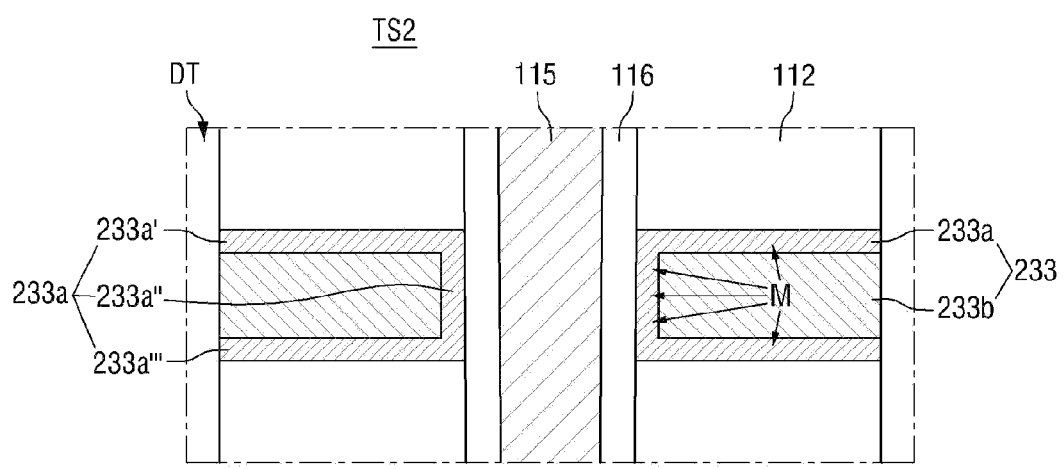
Figure 6:
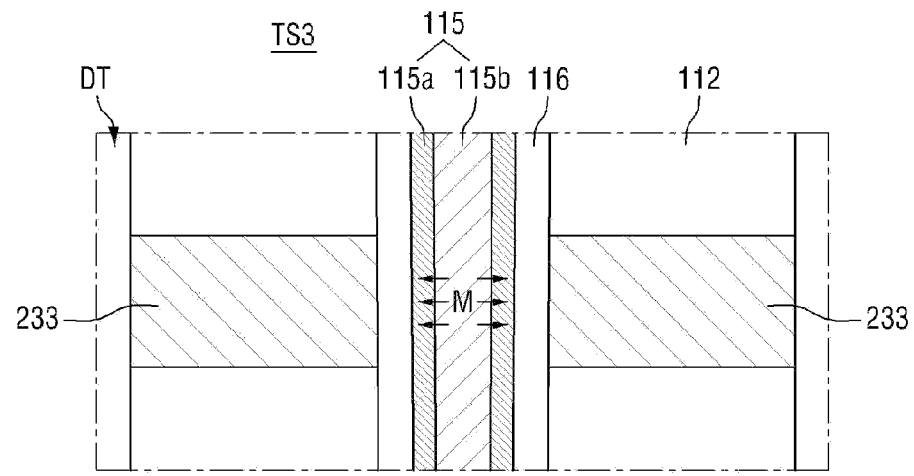
Figure 7:
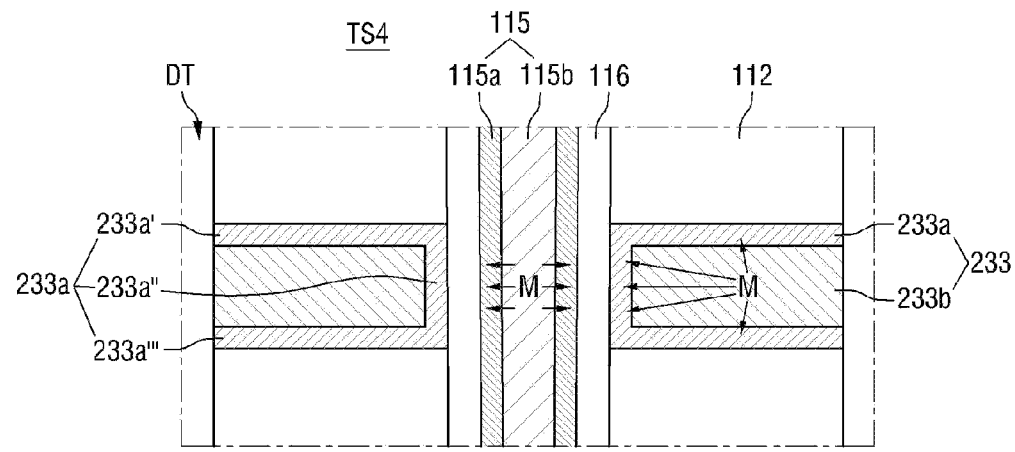

FIGS. 5-7 are enlarged cross-sectional diagrams of nonvolatile memory cells according to some example embodiments. Referring to FIG. 5, a second electrode 233 of a nonvolatile memory cell TS2 according to at least one example embodiment may include a diffusion barrier film 233a and a conductive film 233b which may be, for example, made of metal. The diffusion barrier film 233a may contact a resistance change film 116, and the conductive film 233b may be on the diffusion barrier film 233a. The diffusion barrier film 233a may be along a bottom surface 233a' of a second interlayer insulating film 112, a side surface 233a" of the resistance change film 116, and a top surface 233a''' of another second interlayer insulating film 112 to surround part of the conductive film 233b.

The conductive film 233b (e.g., metal) may contain a conductive material M (e.g., metal particles), and the diffusion barrier film 233a may prevent or reduce diffusion of the conductive material M in the conductive film 233b to the resistance change film 116 and/or the second interlayer insulating films 112. According to at least one example embodiment, the conductive material M in the conductive film 233b includes metal. Examples of a combination of the conductive film 233b and the diffusion barrier film 233a may include, but not limited to, W/TiN and/or Ta/TiN. Side surfaces of the second interlayer insulating films 112, a side surface of the diffusion barrier film 233a, and a side surface of the conductive film 233b which may be exposed by an isolation trench DT may be aligned with each other.

Referring to FIG. 6, a first electrode 115 of a nonvolatile memory cell TS3 according to at least one example embodiment may include a diffusion barrier film 115a and a conductive film 115b which may be made of metal. The diffusion barrier film 115a may contact a resistance change film 116 and extend parallel to the resistance change film 116, and the conductive film 115b may be on the diffusion barrier film 115a. The conductive film 115b may contain a conductive material M (e.g., metal particles), and the diffusion barrier film 115a may prevent or reduce diffusion of the conductive material M contained in the conductive film 115b to the resistance change film 116. Examples of a combination of the conductive film 115b and the diffusion barrier film 115a may include, but may not be limited to, W/TiN and/or Ta/TiN.

Referring to FIG. 7, a first electrode 115 and a second electrode 233 of a nonvolatile memory cell TS4 according to at least one example embodiment may respectively include diffusion barrier films 115a and 233a and conductive films 115b and 233b which may contain, for example, metal. The diffusion barrier films 115a and 233a may prevent or reduce diffusion of a conductive material M contained in the conductive films 115b and 233b a resistance change film 116b and/or second interlayer insulating films 112. According to some example embodiments, the resistance change film 116 may directly contact the first electrode 115 and the second electrode 233. No diode may be between the resistance change film 116 and each of the first and second electrodes 115 and 233. The reason why no diode may be between the resistance change film 116 and each of the first and second electrodes 115 and 233 may be that the nonvolatile memory cells TS1-TS4 according to example embodiments have voltage-current characteristics of a bidirectional diode.

Figure 8:
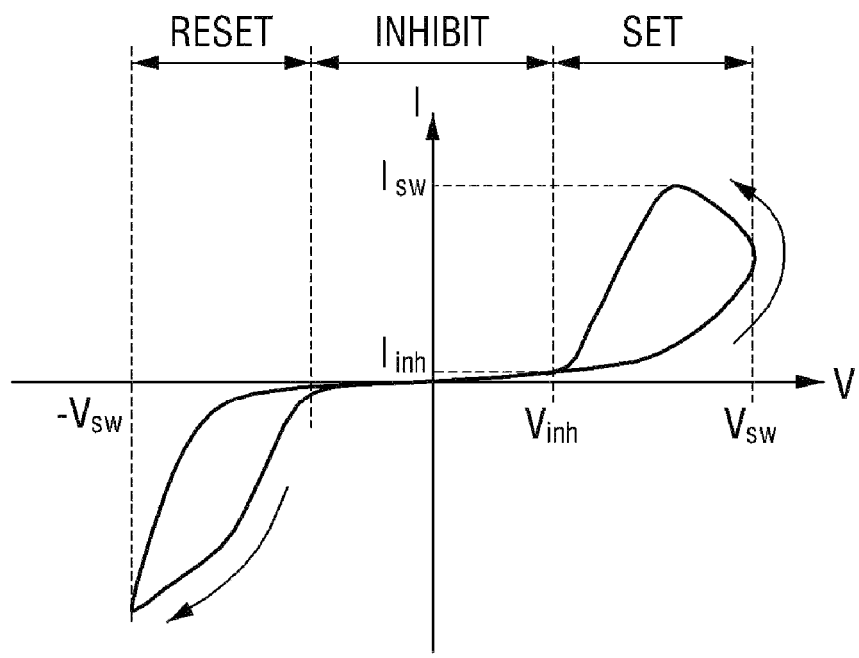

FIG. 8 is a graph of current as a function of voltage illustrating device characteristics of nonvolatile memory cells according to example embodiments. The voltage-current curve shown in FIG. 8 represents a current I flowing through the resistance change film 116 according to a voltage V that may be applied to each of the nonvolatile memory cells TS1-TS4. The voltage-current curve may include a first section INHIBIT and a second section SET and RESET. In the first section INHIBIT, a current (e.g., an inhibit current Iinh) close to almost zero flows through a cell as if a diode were included in the cell even when a voltage (e.g., an inhibit voltage Vinh) is applied to the cell. The resistance of the resistance change film 116 may remain unchanged in the first section INHIBIT. In the second sections SET and RESET, a switching current Isw (and −Isw) may flow through a cell in response to a switching voltage $V_{SW}$ (and $-V_{SW}$) that may be applied to the cell, and the resistance of the resistance change film 116 may change.

Because the resistance of the resistance change film 116 may remain unchanged in the first section INHIBIT, the nonvolatile memory cells TS1-TS4 may not be programmed in the first section INHIBIT. Because the resistance of the resistance change film 116 may change in the second section SET and RESET, the nonvolatile memory cells TS1-TS4 may be programmed in the second section SET and RESET.

For example, the resistance of the resistance change film 116 may remain unchanged while the inhibit voltage Vinh is applied to the resistance change film 116 in a reset state (a resistance level of the RESET section). When a set voltage (e.g., the switching voltage $V_{SW}$) that exceeds the inhibit voltage Vinh is applied to the resistance change film 116, the resistance of the resistance change film 116 may change to a set state (a resistance level of the SET section). The resistance of the resistance change film 116 may remain unchanged while the inhibit voltage Vinh is applied to the resistance change film 116 in the set state (the resistance level of the SET state). When a reset voltage $-V_{SW}$ that exceeds the inhibit voltage Vinh is applied to the resistance change film 116, the resistance of the resistance change film 116 may change to the reset state (the resistance level of the RESET section). The nonvolatile memory cells TS1-TS4 according to example embodiments may store data in the resistance change film 116 using this principle.

The resistance of the resistance change film 116 in the first section INHIBIT may be greater than that of the resistance change film 116 in the second section SET and RESET. The resistance of the resistance change film 116 in the first section INHIBIT may be greater than a maximum value of the resistance of the resistance change film 116 in the second section SET and RESET. A current (e.g., the inhibit current Iinh) flowing through the resistance change film 116 in the first section INHIBIT may be smaller than a current (e.g., the switching current Isw) flowing through the resistance change film 116 in the second section SET and RESET. According to some example embodiments, the magnitude of the current (e.g., the inhibit current Iinh) flowing through the resistance change film 116 in the first section INHIBIT may be about zero (e.g., close to 0).

When the inhibit voltage Vinh is applied to the nonvolatile memory cells TS1-TS4 according to at least one example embodiment, the magnitude of the current (e.g., the inhibit current Iinh) flowing through the resistance change film 116 may be about zero. Although no diode is between the resistance change film 116 and each of the first and second electrodes 115 and 233 according to at least some example embodiments, the nonvolatile memory cells TS1-TS4 may have characteristics of a bidirectional diode. There may be no need to form a diode between the first and second electrodes 115 and 233 and the resistance change film 116 of the nonvolatile memory cells TS1-TS5 according to at least one example embodiment.

A case where the nonvolatile memory cells TS1-TS4 may not be selected to be programmed corresponds to the first section INHIBIT (see FIG. 8) of the voltage-current curve of the nonvolatile memory cells TS1-TS4. Due to the presence of the first section INHIBIT, when one of n nonvolatile memory cells (n≥2, where n is a natural number) in a nonvolatile memory device according to example embodiments is programmed while the other (n−1) nonvolatile memory cells are not programmed, the magnitude of a current flowing through the programmed nonvolatile memory cell may be greater than the magnitude of the sum of currents flowing through the (n−1) nonvolatile memory cells.

Figure 31:
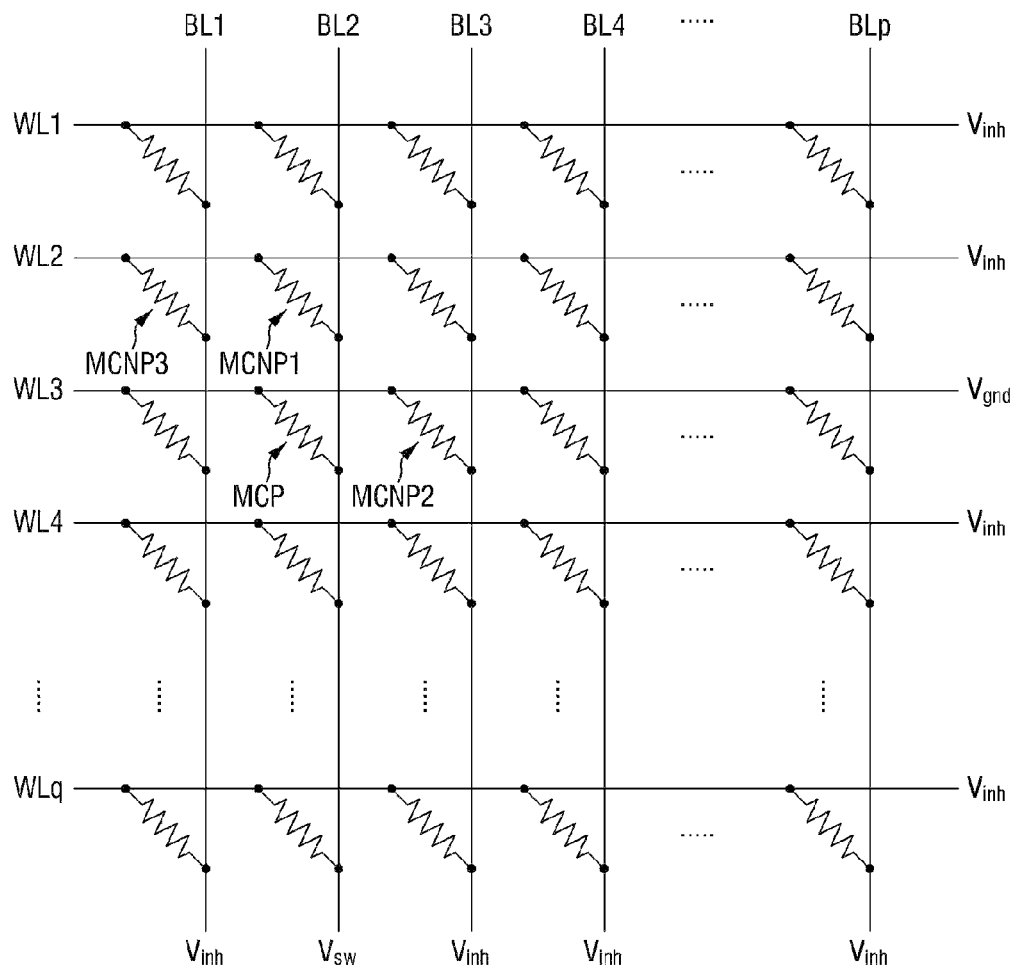
Figure 32:
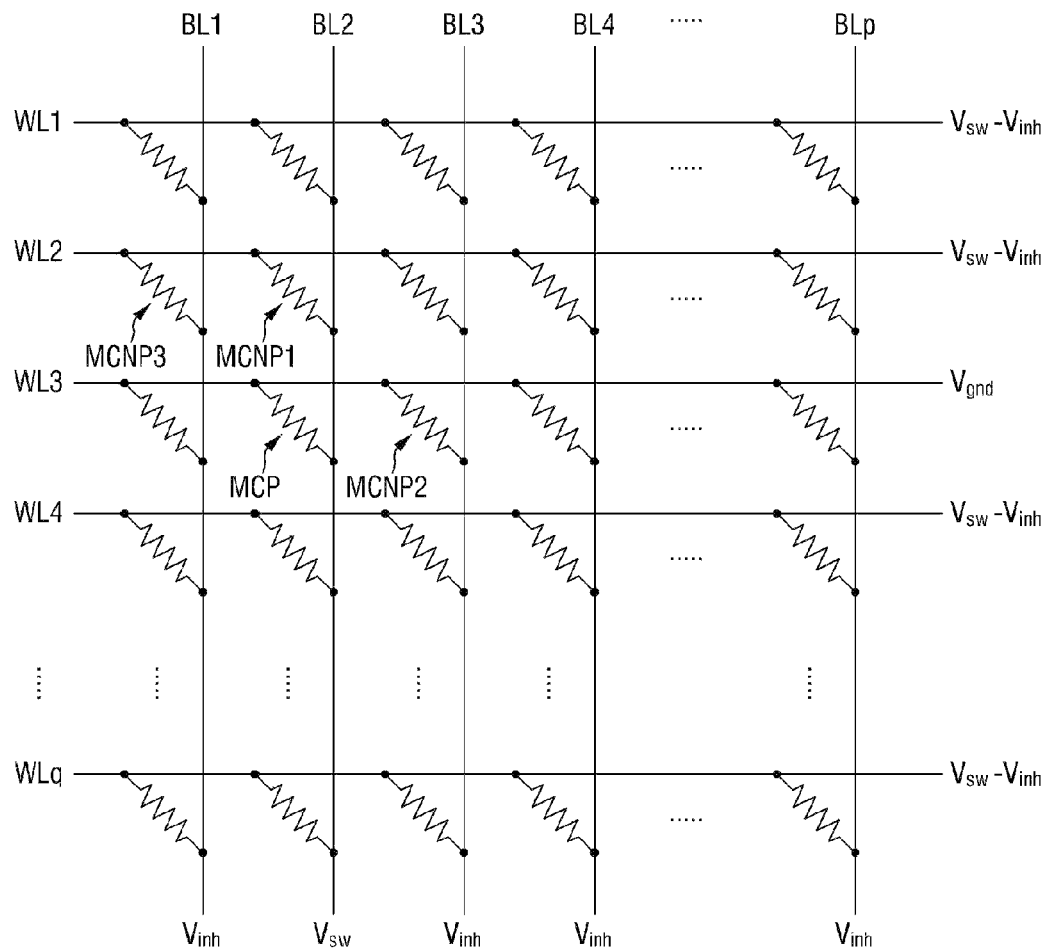

FIGS. 31 and 32 are circuit diagrams illustrating memory cell arrays including nonvolatile memory cells according to example embodiments. Referring to FIG. 31, a plurality of first electrodes 115, a plurality of second electrodes 233, and a plurality of resistance change film 116 according to example embodiments may define n (n=p×q, where p and q are natural numbers) nonvolatile memory cells. The first electrodes 115 may be, for example, p bit lines BL1-BLp, and the second electrodes 233 may be, for example, q word lines WL1-WLq. Each of the resistance change films 116 in regions in which the bit lines BL1-BLp may intersect the word lines WL1-WLq, respectively, may define one memory cell MCP. In the memory cell array of FIG. 31, p memory cells MCP may be defined in a horizontal direction, and q memory cells MCP may be defined in a vertical direction. A total of n (n=p×q) nonvolatile memory cells may be defined.

It may be assumed that a memory cell MCP may be defined in a region in which a second bit line BL2 intersects a third word line WL3 is programmed and that the other memory cells are not programmed. In this case, the switching voltage $V_{SW}$ shown in FIG. 8 may be applied to the memory cell MCP in order to program the memory cell MCP. The switching voltage $V_{SW}$ may be applied to the second bit line BL2, and a ground voltage Vgnd may be applied to the third word line WL3. Because the other memory cells MCNP1-MCNP3 may not be programmed, the inhibit voltage Vinh shown in FIG. 8 may be applied to the other bit lines BL1 and BL3-BLp and the other word lines WL1, WL2 and WL4-WLq.

A voltage of (Vsw−Vinh) may be applied to (q−1) memory cells (e.g., MCNP1) which share the second bit line BL2 with the memory cell MCP which may be programmed but may not be programmed. The inhibit voltage Vinh may be applied to (p−1) memory cells (e.g., MCPN2) which may not be programmed and may share the third word line WL3 with the memory cell MCP which may be programmed. No potential difference may exist between the bit lines BL1 and BL3-BLp and the word lines WL1, WL2 and WL4-WLq in memory cells (e.g., MCNP3) which may not share the second bit line BL2 and the third word line WL3 with the memory cell MCP and may not be programmed. No voltage may be applied to these memory cells.

According to some example embodiments, the sum of a current Ia that may be flowing through the (q−1) memory cells (e.g., MCNP1) which may share the second bit line BL2 with the memory cell MCP but may not be programmed, a current Ib that may be flowing through the (p−1) memory cells (e.g., MCNP2) which may share the third word line WL3 with the memory cell MCP but may not be programmed, and a current Ic that may be flowing through the memory cells (e.g., MCNP3) which may not share the second bit line BL2 or the third word line WL3 with the memory cell MCP and may not be programmed may be smaller than the switching current Isw (see FIG. 8) that may be flowing through the memory cell MCP being programmed. Nonvolatile memory devices according to the example embodiments may satisfy the following equation.

$$Ia+Ib+Ic=((Vsw-Vinh)/R1\times(q-1))+(Vinh/R2\times(p-1))+0=Iinh\times(n-1)<Isw,$$

where R1 may represent a resistance value of a memory cell which shares a bit line (e.g., BL2) with a memory cell MCP (which may be programmed) but may not be programmed, and R2 may represent a resistance value of a memory cell which shares a word line (e.g., WL3) with the memory cell MCP but may not be programmed.

To program one MCP of the n memory cells, voltages different from above example embodiment may be applied to the bit lines BL1-BLp and the word lines WL1-WLq.

Referring to FIG. 32, to program the memory cell MCP that may be defined in the region in which the second bit line BL2 and the third word line WL3 may intersect each other and may not program the other memory cells, the switching voltage Vsw may be applied to the second bit line BL2, the ground voltage Vgnd may be applied to the third word line WL3, and the voltage of (Vsw−Vinh) may be applied to the other bit lines BL1 and BL3-BLp and Vinh may be applied to the other word lines WL1, WL2 and WL4-WLq.

The inhibit voltage Vinh may be applied to the (q−1) memory cells (e.g., MCNP1) which may not be programmed and share the second bit line BL2 with the memory cell MCP which may be programmed. The inhibit voltage Vinh may be applied to the (p−1) memory cells (e.g., MCPN2) which may not be programmed and may share the third word line WL3 with the memory cell MCP which may be programmed. A voltage of (Vsw−2Vinh) may be applied to the memory cells (e.g., MCNP3) which may not share the second bit line BL2 and the third word line WL3 with the memory cell MCP and may not be programmed.

The sum of the current Ia that may be flowing through the (q−1) memory cells (e.g., MCNP1) which may share the second bit line BL2 with the memory cell MCP but may not be programmed, the current Ib that may be flowing through the (p−1) memory cells (e.g., MCNP2) which may share the third word line WL3 with the memory cell MCP but may not be programmed, and the current Ic that may be flowing through the memory cells (e.g., MCNP3) which may not share the second bit line BL2 and the third word line WL3 with the memory cell MCP and may not be programmed may be smaller than the switching current Isw (see FIG. 8) that may be flowing through the memory cell MCP which may be programmed.

The voltage-current characteristics illustrated in FIG. 8 may be achieved by controlling characteristics of the first and second electrodes 115 and 233 and the resistance change film 116. For example, the first and second electrodes 115 and 233 may be made to have a work function of 4.0-6 eV, and the resistance change film 116 may be made to have N-type semiconductor characteristics by a lack of oxygen. The voltage-current characteristics illustrated in FIG. 8 may be achieved. Examples of the first and second electrodes 115 and 233 with these characteristics may include noble metal, for example, Pt, Jr and Ru, noble metal oxides, metal silicide such as TiN and TaN, and transition metal such as W and Cu. Examples of the resistance change film 116 with the above-described characteristics may include $HfO_{2-x}$, $TiO_{2-x}$, and $TaO_{2-x}$. Characteristics of the first and second electrodes 115 and 233 and the resistance change film 116 which may achieve the voltage-current characteristics illustrated in FIG. 8 may not be limited to the above-described characteristics.

According to some example embodiments, to achieve the voltage-current characteristics illustrated in FIG. 8, the first and second electrodes 115 and 233 may be made to have a work function of 4.0 eV or less, and the resistance change film 116 may be made of a metal oxide film having P-type semiconductor characteristics by an excess of oxygen. According to example embodiments, a resistance change memory cell may be implemented without the formation of a diode in a nonvolatile memory cell. The integration density of the nonvolatile memory devices may be increased (e.g., significantly increased).

Figure 9:
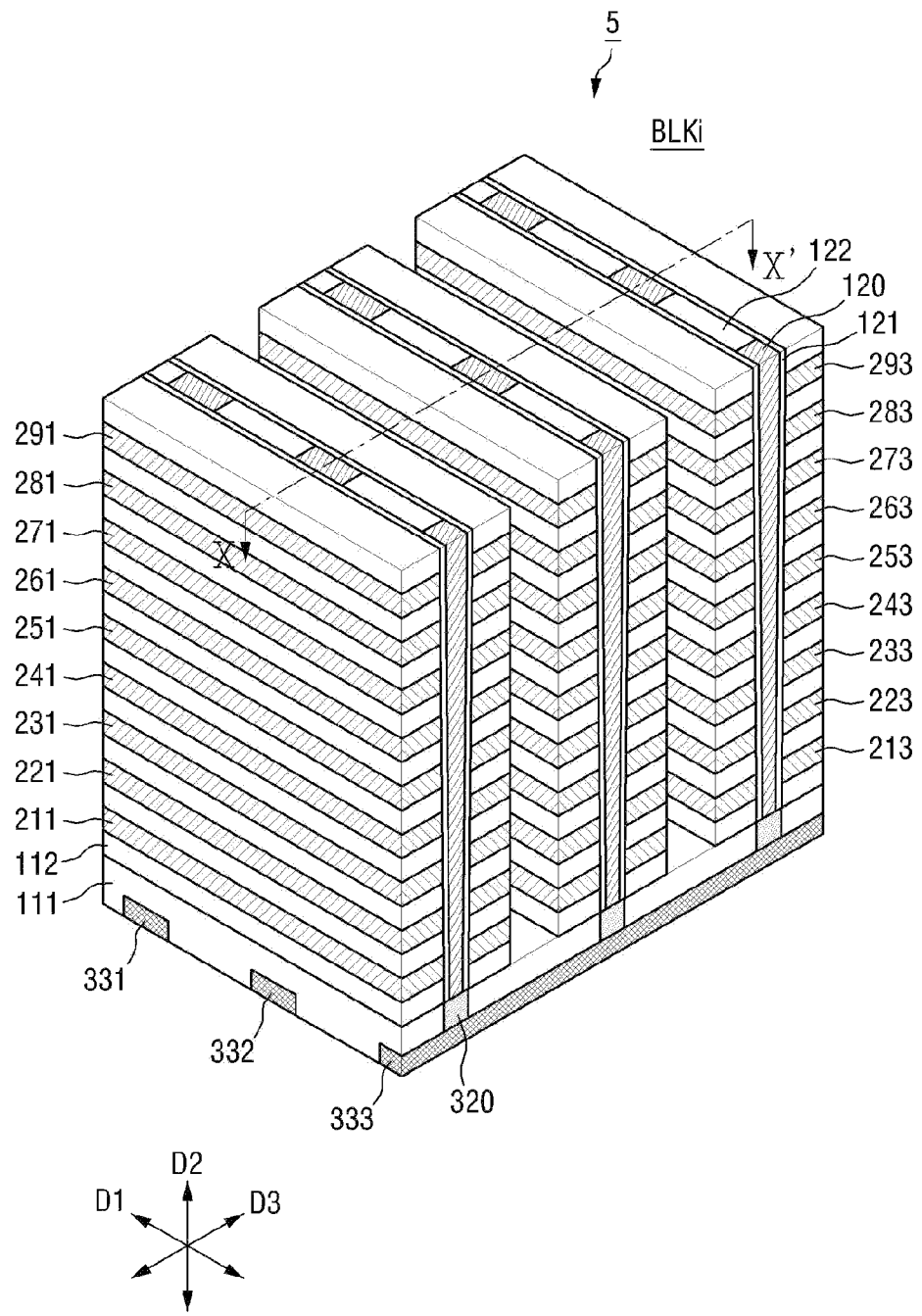
Figure 10:
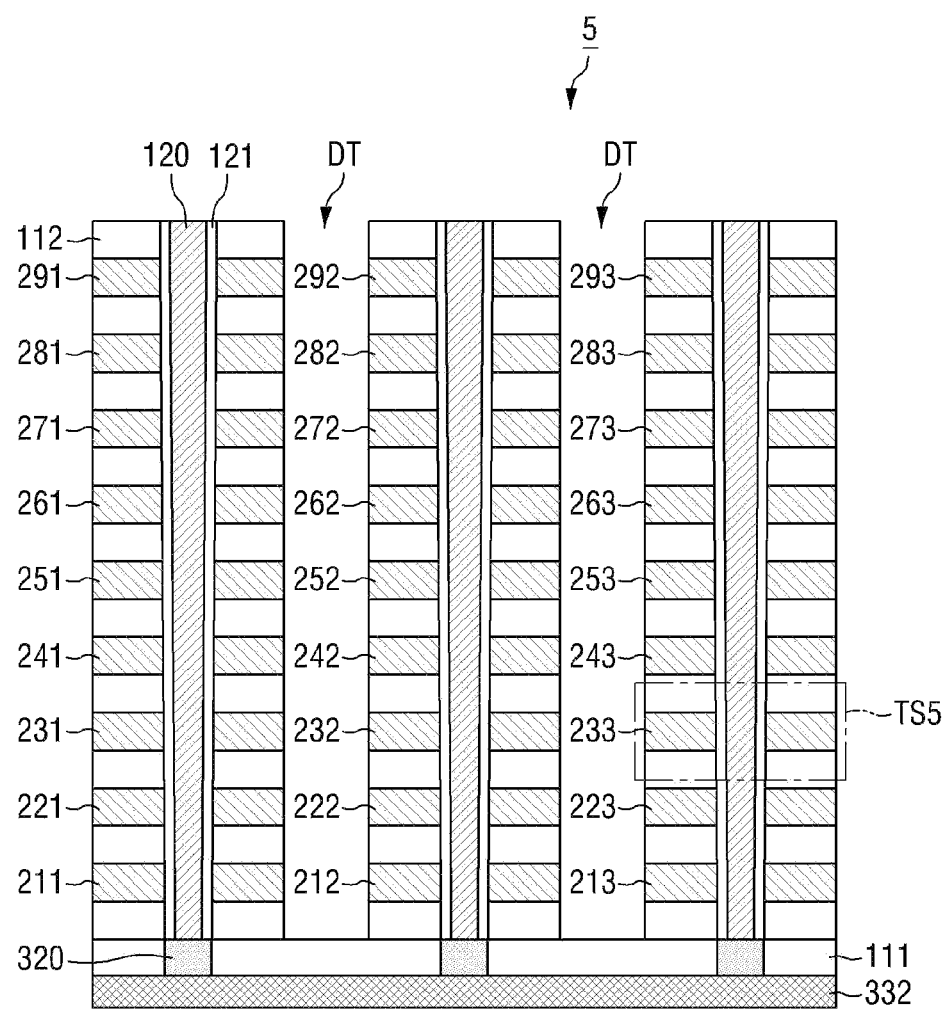
Figure 11:
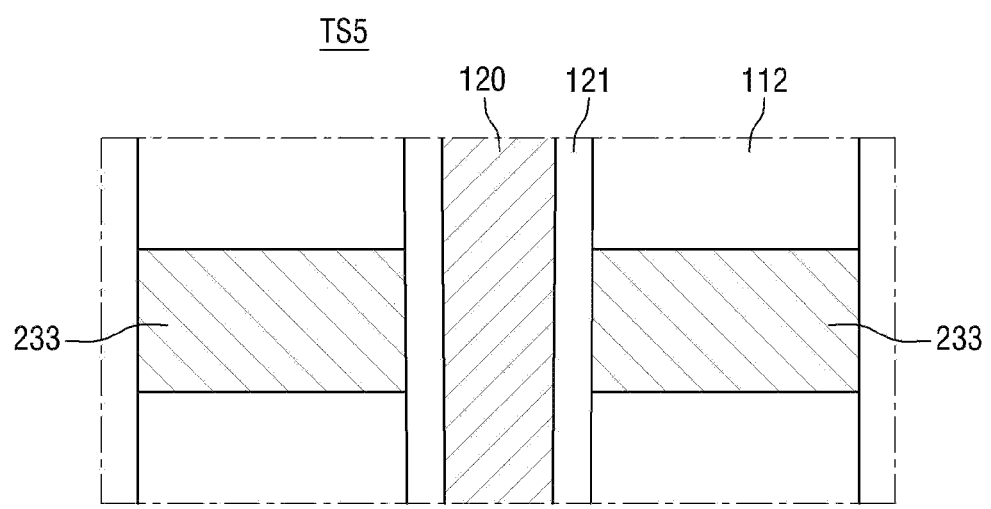

FIG. 9 is a perspective diagram illustrating nonvolatile memory devices according to other example embodiments. FIG. 10 is a cross-sectional diagram taken along the line X-X' of FIG. 9. FIG. 11 is an enlarged cross-sectional diagram illustrating a region TS5 of FIG. 10. For simplicity, the following description may focus on differences from the nonvolatile memory devices described above. Referring to FIGS. 9-11, a nonvolatile memory device 5 according to at least one example embodiment may include a plurality of isolation insulating films 122. The isolation insulating films 122 may penetrate a plurality of second interlayer insulating films 112 and a plurality of second electrodes 211-291, 212-292 and 213-293. The isolation insulating films 122 may extend parallel to a plurality of first electrodes 120 and a plurality of resistance change films 121. The isolation insulating films 122 may extend in a second direction D2 to be parallel to the first electrodes 120 and the resistance change films 121 which may penetrate a plurality of second interlayer insulating films 112 and the second electrodes 211-291, 212-292 and 213-293. The resistance change films 121 may extend not only in the second direction D2 but also in a first direction D1. The first electrodes 120 and the resistance change films 121 may surround side surfaces of the isolation insulating films 122.

In FIG. 11, each of a first electrode 120 and a second electrode 233 of a nonvolatile memory cell TS5 may include a diffusion barrier film (not shown). However, the first electrode 120 and the second electrode 233 may be modified according to the above-described example embodiments, for example. A voltage-current curve representing a current flowing through a resistance change film 121 may be as illustrated in FIG. 8, depending on a voltage that may be applied to at least one of the first electrode 120 and the second electrode 233 shown in FIG. 11.

Figure 12:
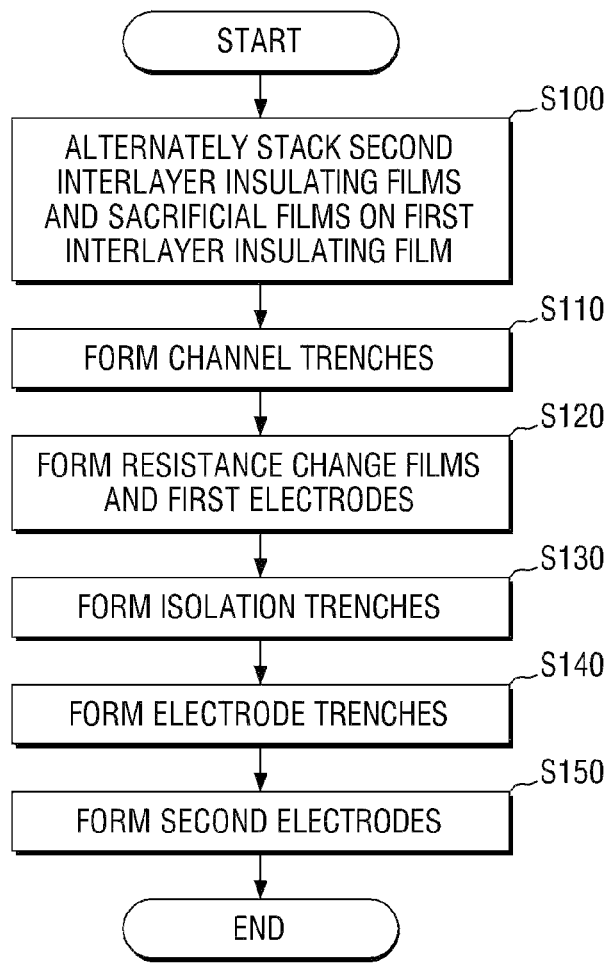
Figure 13:
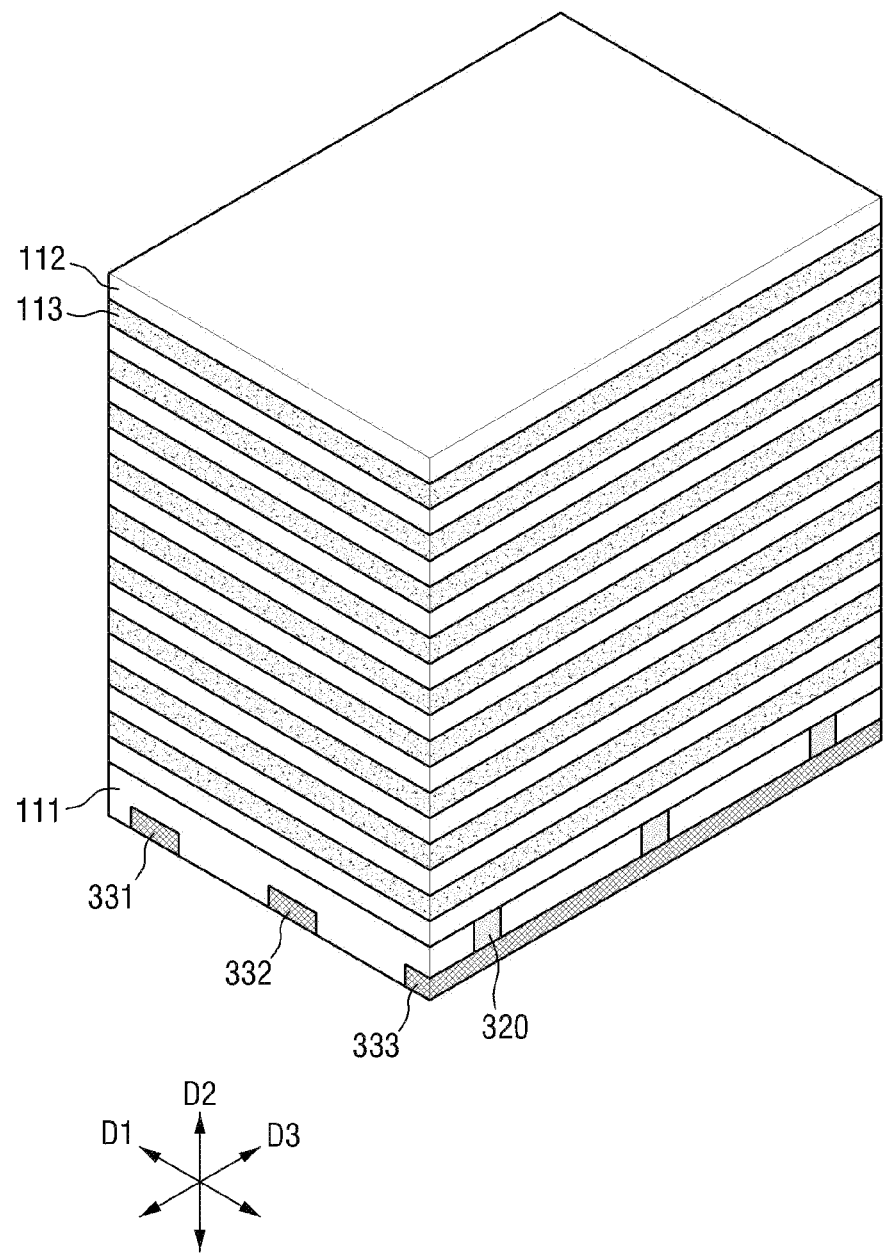

FIG. 12 is a flowchart illustrating methods of manufacturing nonvolatile memory devices according to still other example embodiments. FIGS. 13-18 are perspective diagrams illustrating intermediate processes in the manufacturing method of FIG. 12. Referring to FIGS. 12 and 13, a plurality of second interlayer insulating films 112 and a plurality of sacrificial films 113 may be alternately stacked on a first interlayer insulating film 111 (operation S100). According to some example embodiments, bit lines 331-333 which may be separated from each other and may extend in a third direction D3, and bit line contacts 320 which may be electrically connected to the bit lines 331-333 and may be exposed by the first interlayer insulating film 111 may be formed in the first interlayer insulating film 111. However, this is an example. In other example embodiments, the bit lines 331-333 and the bit line contacts 320 may not be formed in the first interlayer insulating film 111.

The sacrificial films 113 may be made of a material with etch selectivity to the second interlayer insulating films 112. Examples of the sacrificial films 113 and the second interlayer insulating films 112 may include, but are not limited to, a silicon nitride film and a silicon oxide film.

Figure 14:
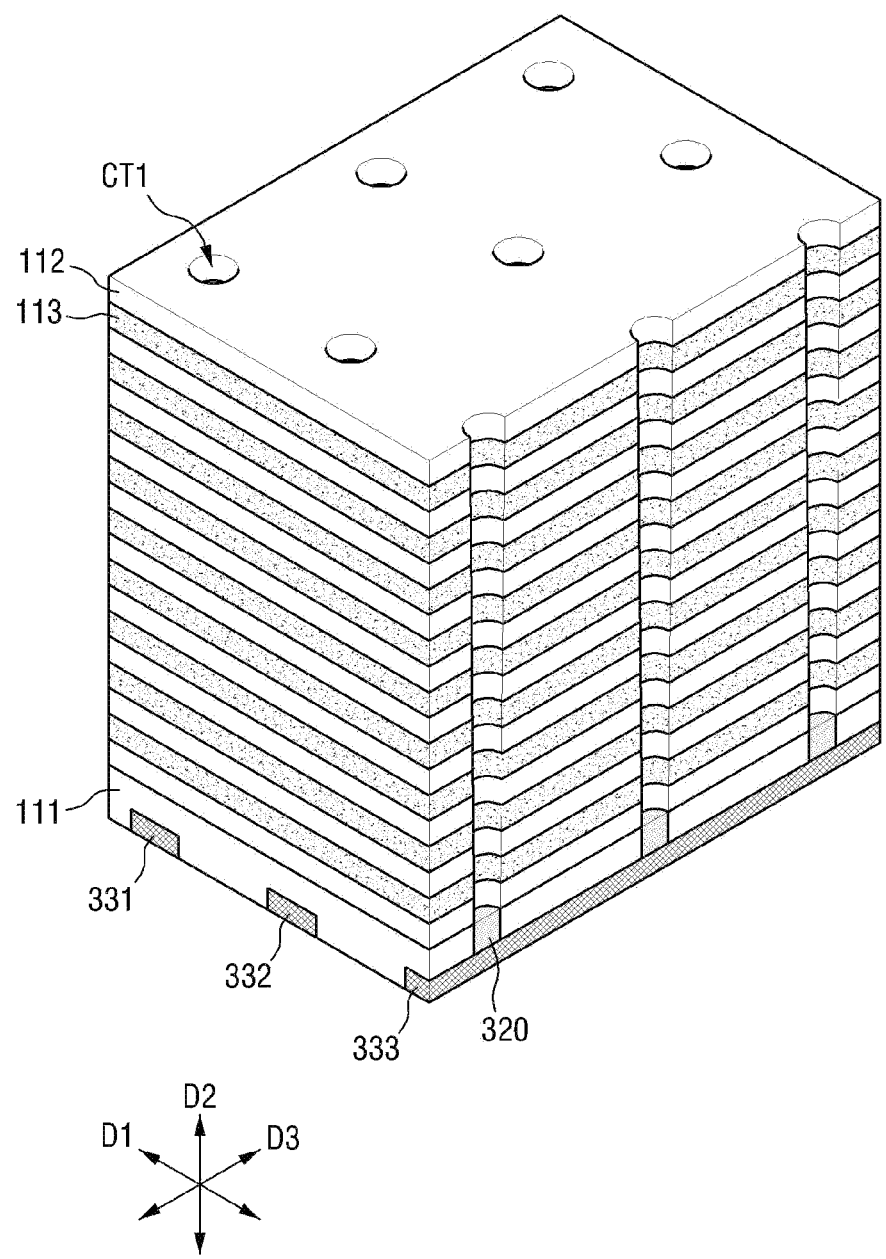

Referring to FIGS. 12 and 14, a plurality of channel trenches CT1 may be formed (operation S110). The channel trenches CT1 which may expose side surfaces of the second interlayer insulating films 112 and side surfaces of the sacrificial films 113 may be formed by, for example, etching the second interlayer insulating films 112 and the sacrificial films 113. The first interlayer insulating film 111 may be exposed by the channel trenches CT1. In some example embodiments, the bit line contacts 320 formed in the first interlayer insulating film 111 may also be exposed by the channel trenches CT1. In FIG. 14, the channel trenches CT1 may be shaped like cylinders. However, the shape of the channel trenches CT1 are be limited to a cylindrical shape. When necessary, the shape of the channel trenches CT1 may be changed to a triangular prism and/or a hexagonal prism, for example.

Figure 15:
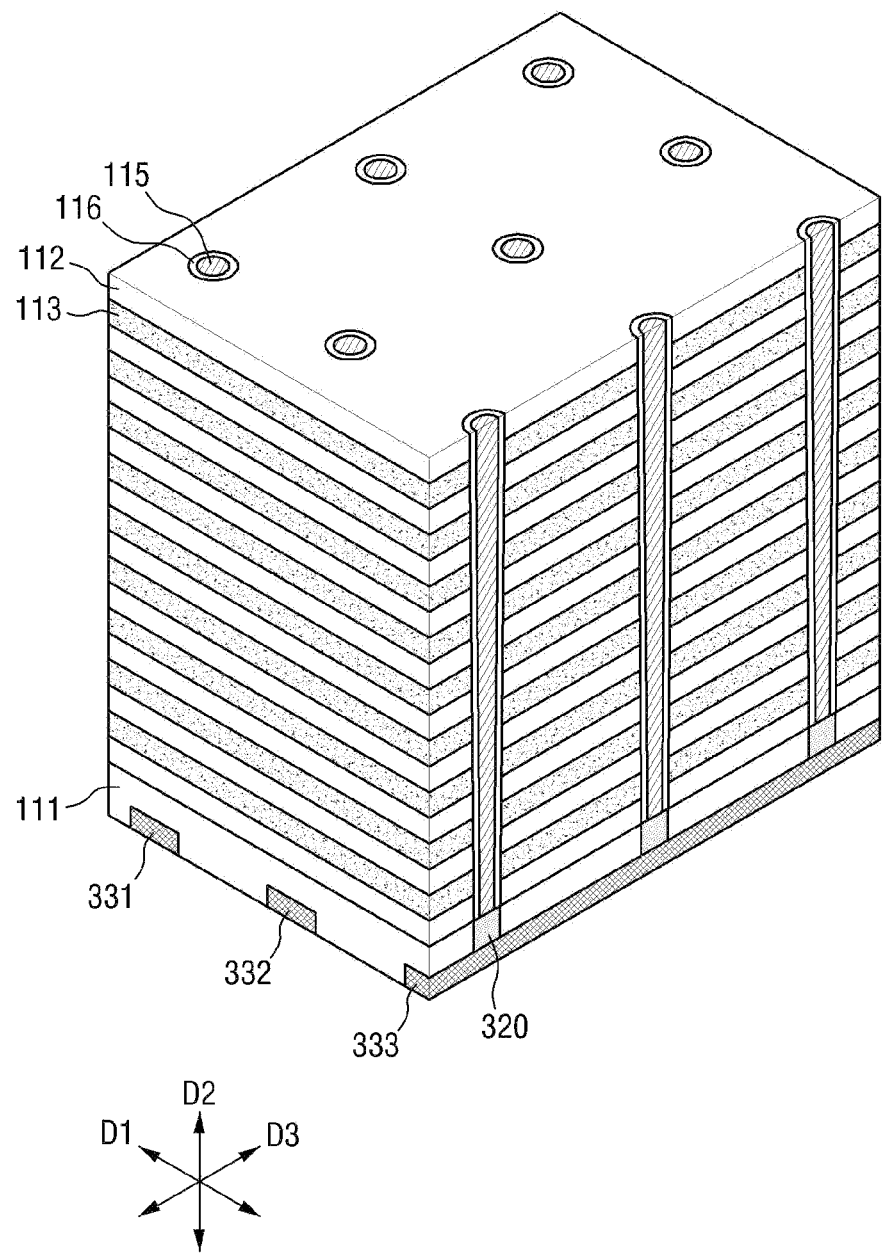

Referring to FIGS. 12 and 15, a plurality of resistance change films 116 and a plurality of first electrodes 115 may be formed (operation S120). Each of the resistance change films 116 may be formed in a corresponding one of the channel trenches CT1 along the exposed side surfaces of the second interlayer insulating films 112 and the exposed side surfaces of the sacrificial films 113. Conductive films (not shown) may be respectively formed in the channel trenches CT1 that may include the resistance change films 116 and may be planarized, thereby forming the first electrodes 115. According to some example embodiments, the first electrodes 115 may contact the bit line contacts 320 that are exposed by the channel trenches CT1.

Each of the first electrodes 115 may include, for example, a conductive film made of metal. Examples of the metal that may form the conductive film of each of the first electrodes 115 may include Ru, RuOx, TiN, Wn, W, Al, Cu, and/or an alloy of these materials. Each of the first electrodes 115 may have a double film structure composed of a conductive film 115b (see FIG. 6) which may contain a conductive material and a diffusion barrier film 115a (see FIG. 6) which may prevent or reduce the diffusion of the conductive material. Each of the first electrodes 115 that may have the double film structure may be formed by forming the diffusion barrier film 115a (see FIG. 6) along a side surface of one of the resistance change films 116 and that may form the conductive film 115b (see FIG. 6) on the diffusion barrier film 115a (see FIG. 6). Examples of the first electrodes 115 with the double film structure may include, but may not be limited to, W/TiN and/or Ta/TiN.

Figure 16:
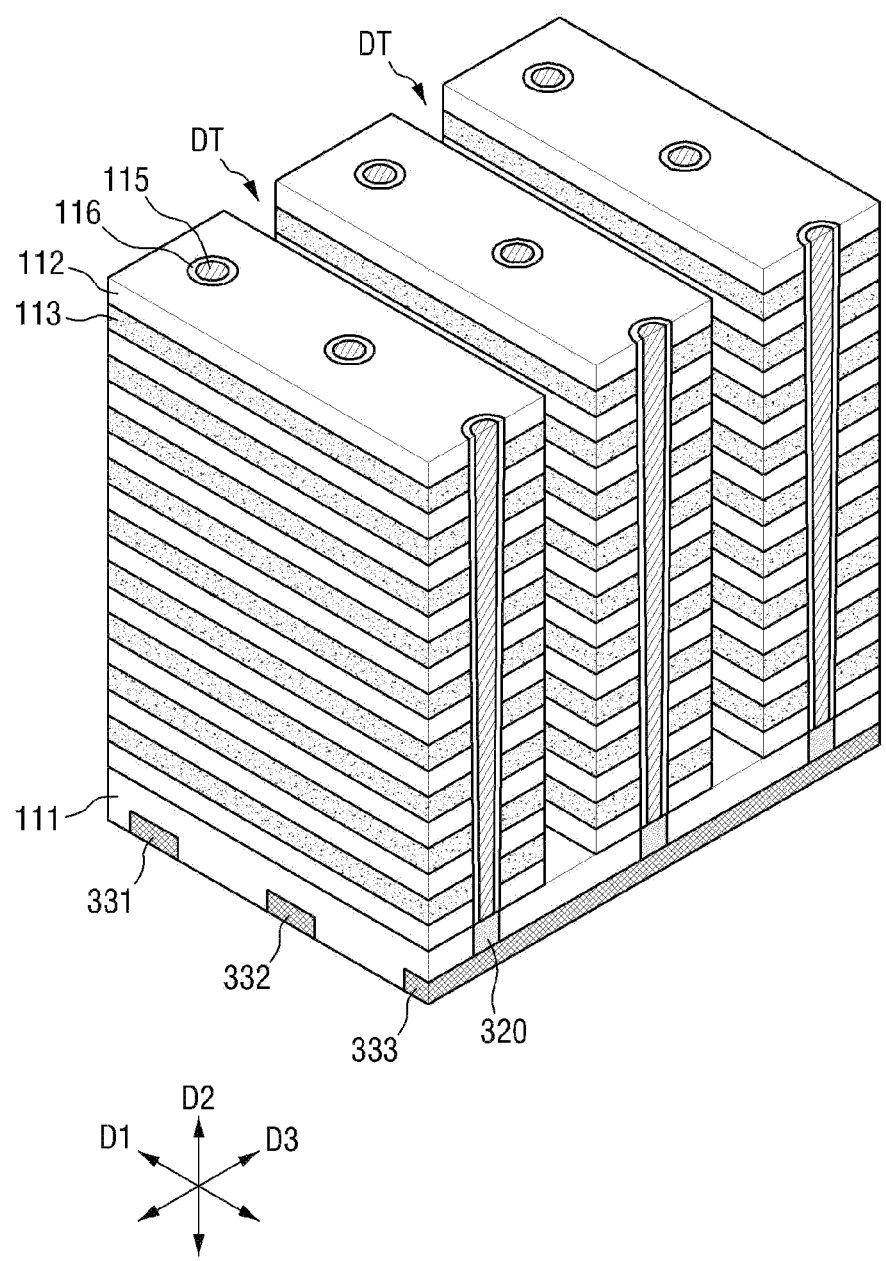

Referring to FIGS. 12 and 16, isolation trenches DT may be formed (operation S130). The isolation trenches DT which may expose side surfaces of the sacrificial films 113 may be formed by etching the second interlayer insulating films 112 and the sacrificial films 113. The isolation trenches DT may be formed to extend in a first direction D1 as shown in FIG. 16.

Figure 17:
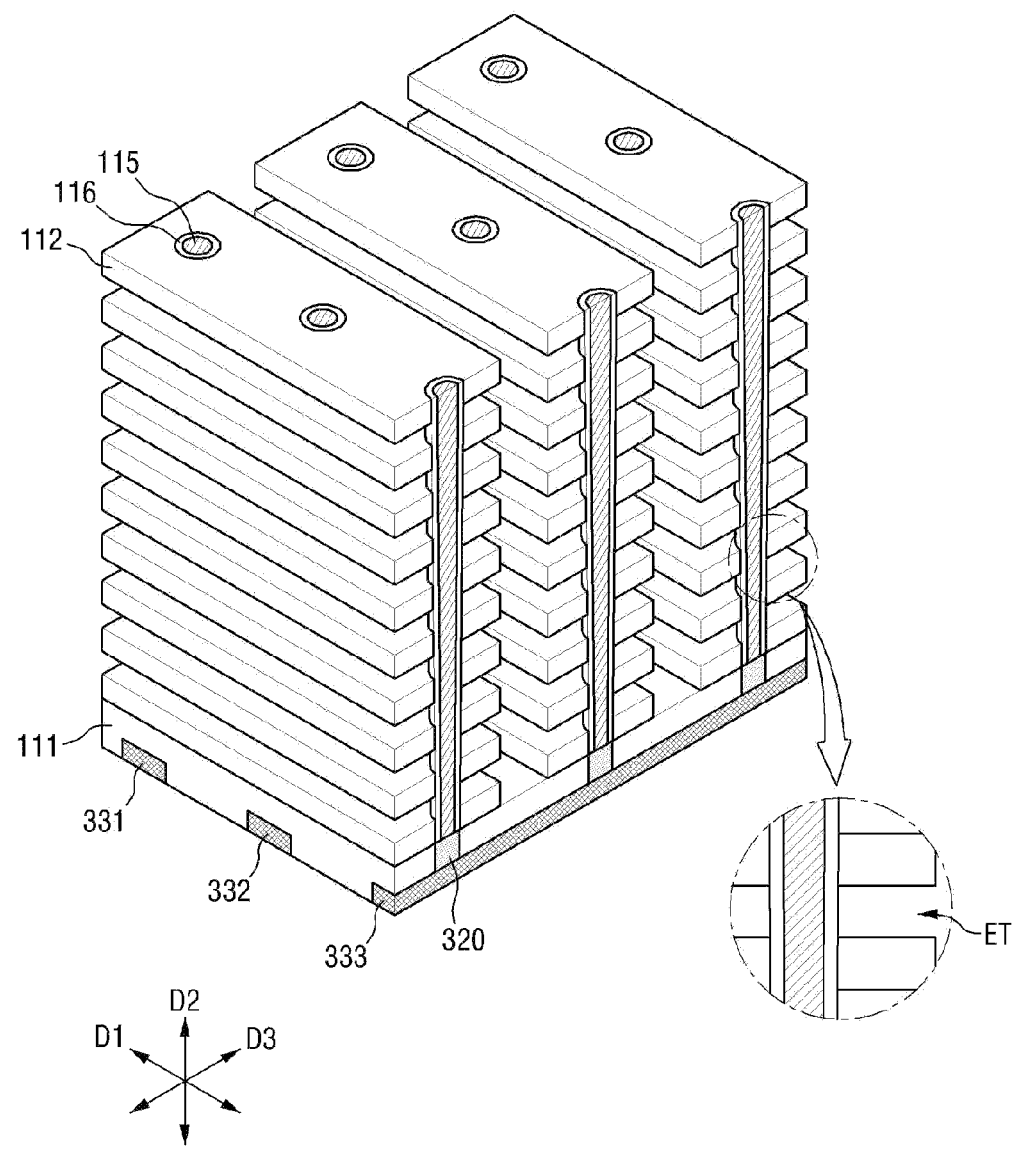

Referring to FIGS. 12 and 17, electrode trenches ET may be formed (operation S140). The electrode trenches ET which may expose side surfaces of the resistance change films 116 may be formed by etching the sacrificial films 113 whose side surfaces may be exposed by the isolation trenches DT (see FIG. 16). The sacrificial films 113 may be etched using an etch selectivity with respect to the second interlayer insulating films 112 and the resistance change films 116. Only the sacrificial films 113 may be etched using, for example, a material or solution with a high etch selectivity to the second interlayer insulating films 112 and the resistance change films 116, thereby forming the electrode trenches ET. Etching the sacrificial films 113 only may be accomplished by, for example, a wet etch process using phosphoric acid and/or HF. However, example embodiments are not limited to a wet etch process.

Figure 18:
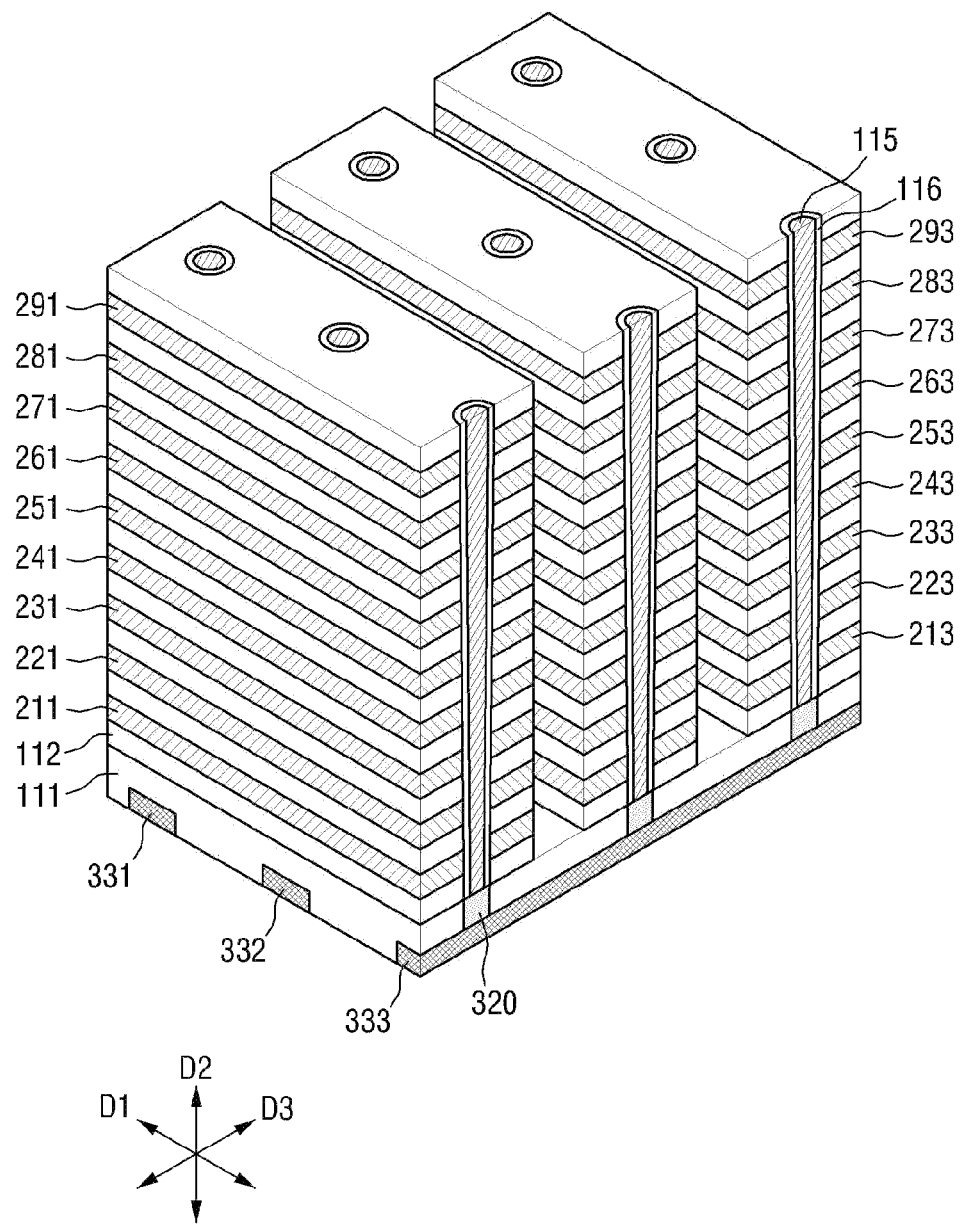

Referring to FIGS. 12 and 18, a plurality of second electrodes 211-291, 212-292 and 213-293 may be formed (operation S150). The electrode trenches ET (see FIG. 17) may be filled with conductive films (not shown). The conductive films (not shown) may be planarized such that nonvolatile memory cells are separated from each other, thereby forming the second electrodes 211-291, 212-292 and 213-293. Each of the second electrodes 211-291, 212-292 and 213-293 may include, for example, a conductive film made of metal. Examples of the metal that may form the conductive film of each of the second electrodes 211-291, 212-292 and 213-293 may include W, Pt, Pd, Rh, Ru, Ir, and/or an alloy of these materials.

Each of the second electrodes 211-291, 212-292 and 213-0293 may be a double film structure composed of a conductive film 233b (see FIG. 5) which may contain a conductive material and a diffusion barrier film 233a (see FIG. 5) which may prevent or reduce the diffusion of the conductive material. Each of the second electrodes 211-291, 212-292 and 213-293 that may be the double film structure may be formed by forming the diffusion barrier film 233a (see FIG. 5) along a bottom surface 233a' (see FIG. 5) of one of the second interlayer insulating films 112, a side surface 233a" of one of the resistance change films 116, and a top surface 233a''' of another one of the second interlayer insulating films 112, forming the conductive film 233b (see FIG. 5) on the diffusion barrier film 233a (see FIG. 5), and then planarizing the diffusion barrier film 233a (see FIG. 5) and the conductive film 233b (see FIG. 5) such that the nonvolatile memory cells may be separated from each other.

In the planarization process, a side surface of each of the second interlayer insulating films 112 (see FIG. 5), a side surface of the diffusion barrier film 233a (see FIG. 5), and a side surface of the conductive film 233b (see FIG. 5) may be aligned to each other. Examples of the second electrodes 211-291, 212-292 and 213-293 with the double film structure may include, but may not be limited to, W/TiN and/or Ta/TiN.

Figure 19:
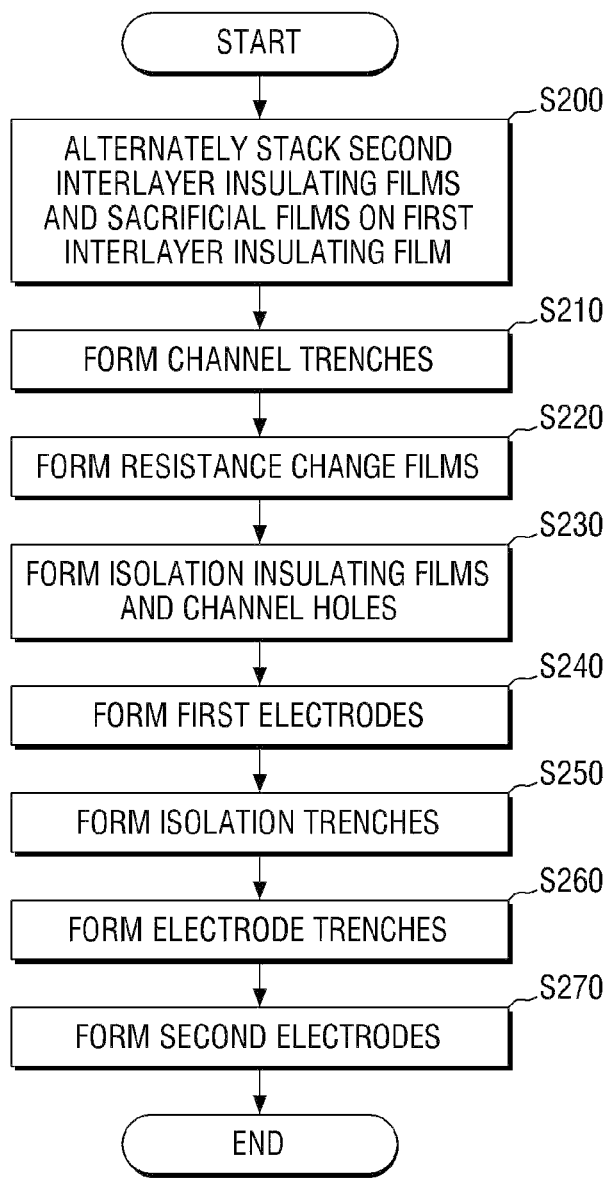

FIG. 19 is a flowchart illustrating methods of manufacturing nonvolatile memory devices according to yet other example embodiments. FIGS. 20-27 are perspective diagrams illustrating intermediate processes in the manufacturing method of FIG. 19. For simplicity, the following description may focus on differences from the methods of manufacturing a nonvolatile memory device described above.

Figure 20:
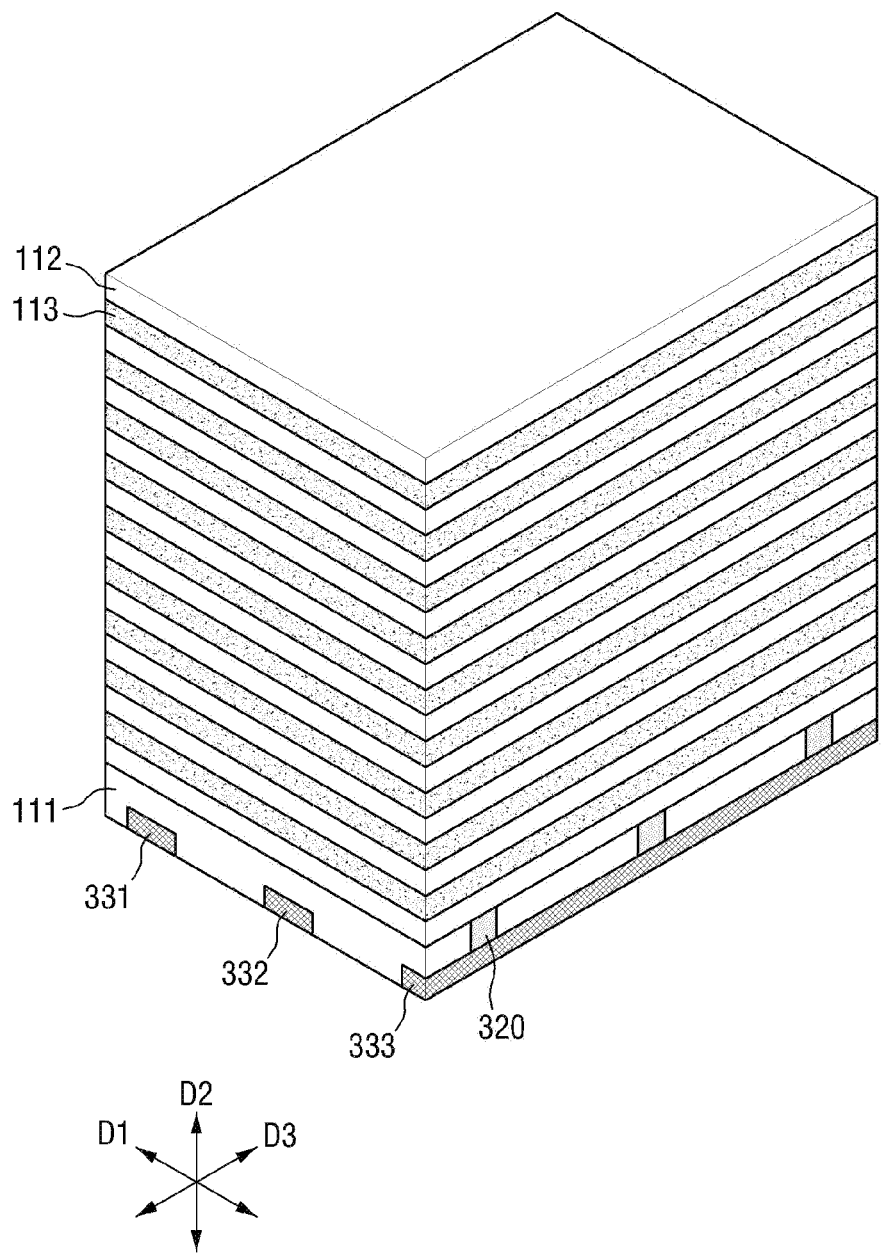
Figure 21:
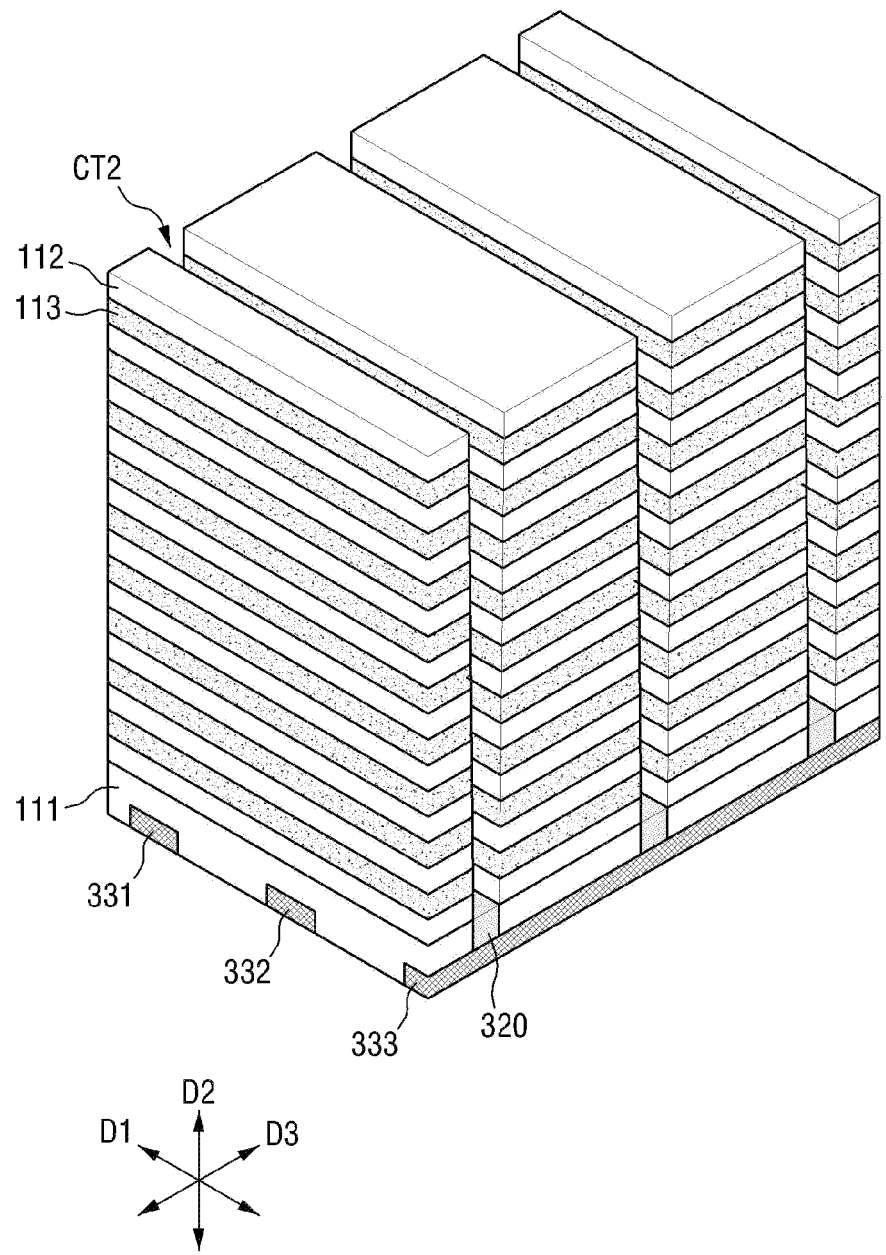

Referring to FIGS. 19 and 20, a plurality of second interlayer insulating films 112 and a plurality of sacrificial films 113 may be alternately stacked on a first interlayer insulating film 111 (operation S200). According to some example embodiments, bit lines 331-333 and bit line contacts 320 may be formed in the first interlayer insulating film 111. Referring to FIGS. 19 and 21, a plurality of channel trenches CT2 may be formed by, for example, etching the interlayer insulating films 112 and the sacrificial films 113 (operation S210). The channel trenches CT2 may be formed to extend in a first direction D1.

Figure 22:
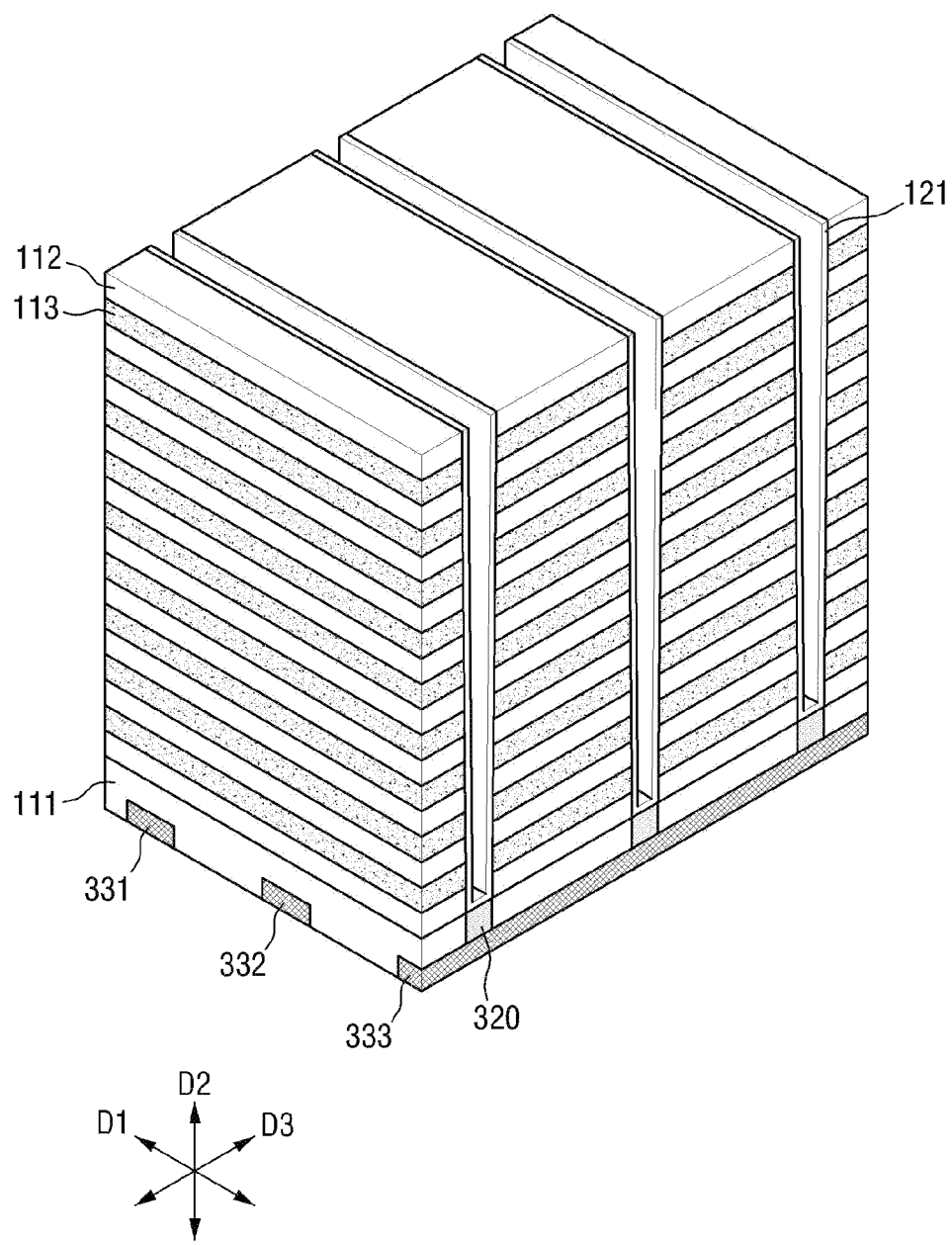

Referring to FIGS. 19 and 22, a plurality of resistance change films 121 may be formed in the channel trenches CT2, respectively (operation S220). Each of the resistance change films 121 may be formed along exposed side surfaces of the second interlayer insulating films 112 and exposed side surfaces of the sacrificial films 113 to extend in the first direction D1.

Figure 23:
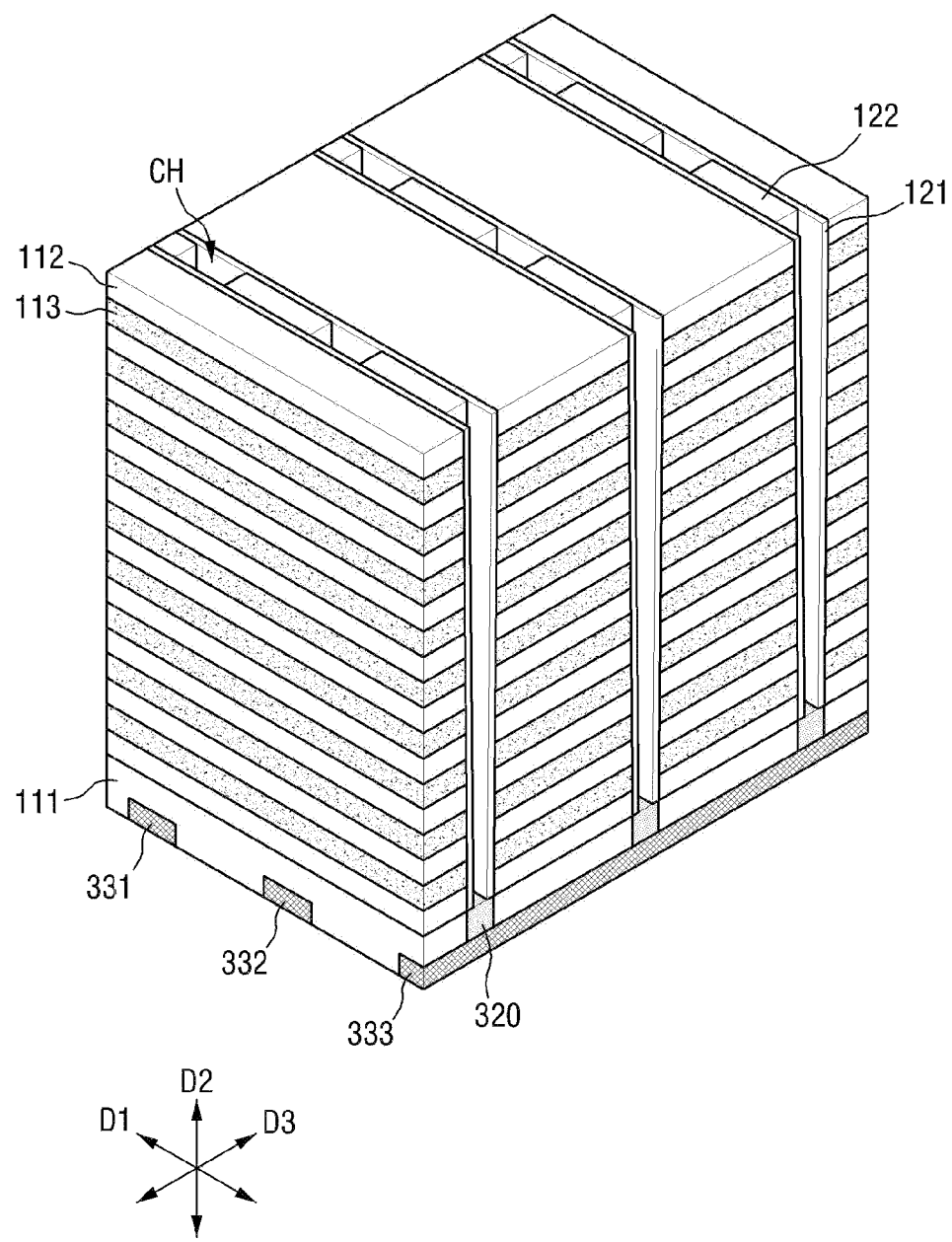

Referring to FIGS. 19 and 23, a plurality of isolation insulating films 122 and a plurality of channel holes CH may be formed in each of the channel trenches CT2 with the resistance change films 121 (operation S230). An oxidation insulating film (not shown) may be formed in each of the channel trenches CT2 with the resistance change films 121. The oxidation insulating film (not shown) may be etched to form the channel holes CH which may expose the first interlayer insulating film 111 and the isolation insulating films 122. According to some example embodiments, the bit line contacts 320 formed in the first interlayer insulating film 111 may be exposed by the channel holes CH.

Figure 24:
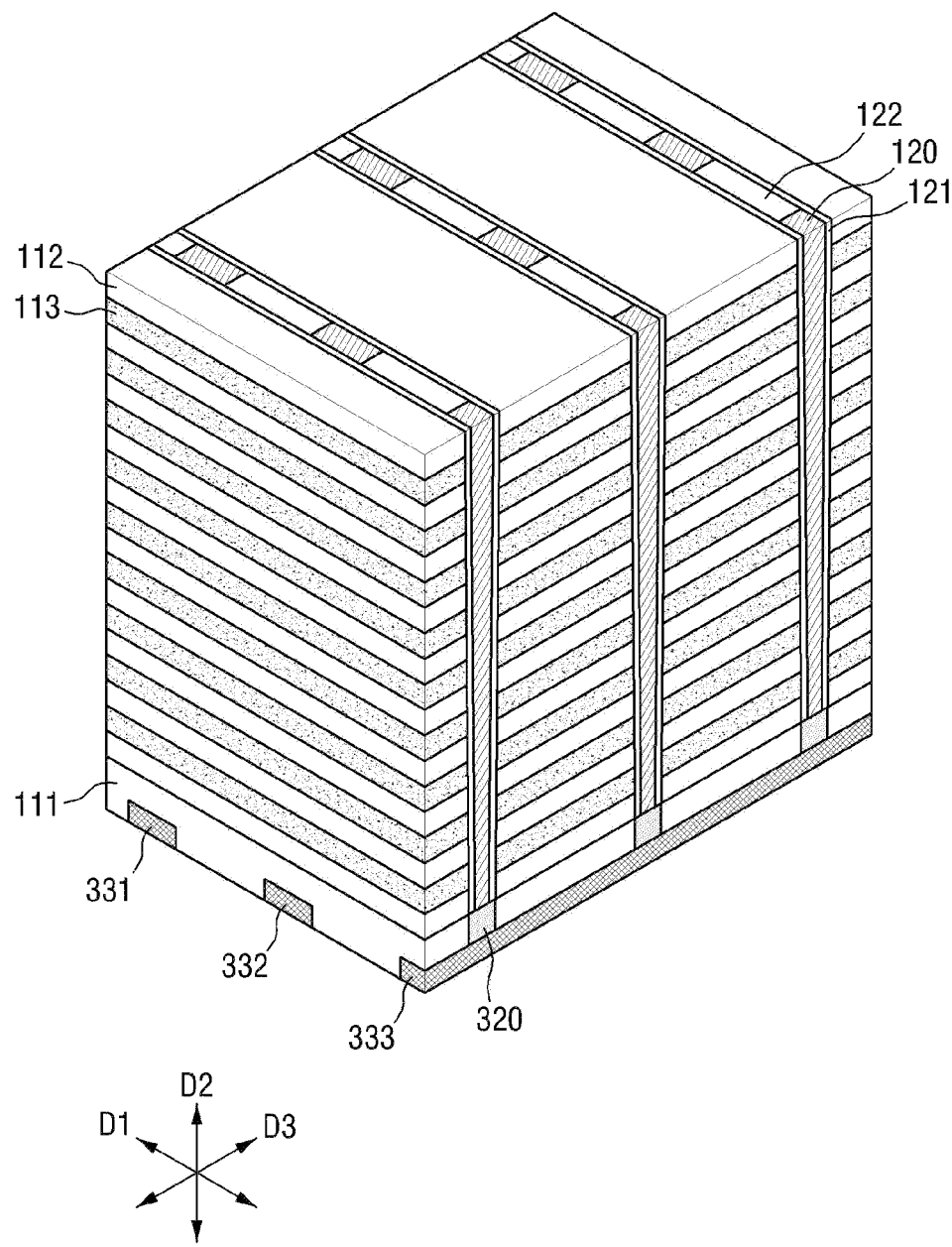
Figure 25:
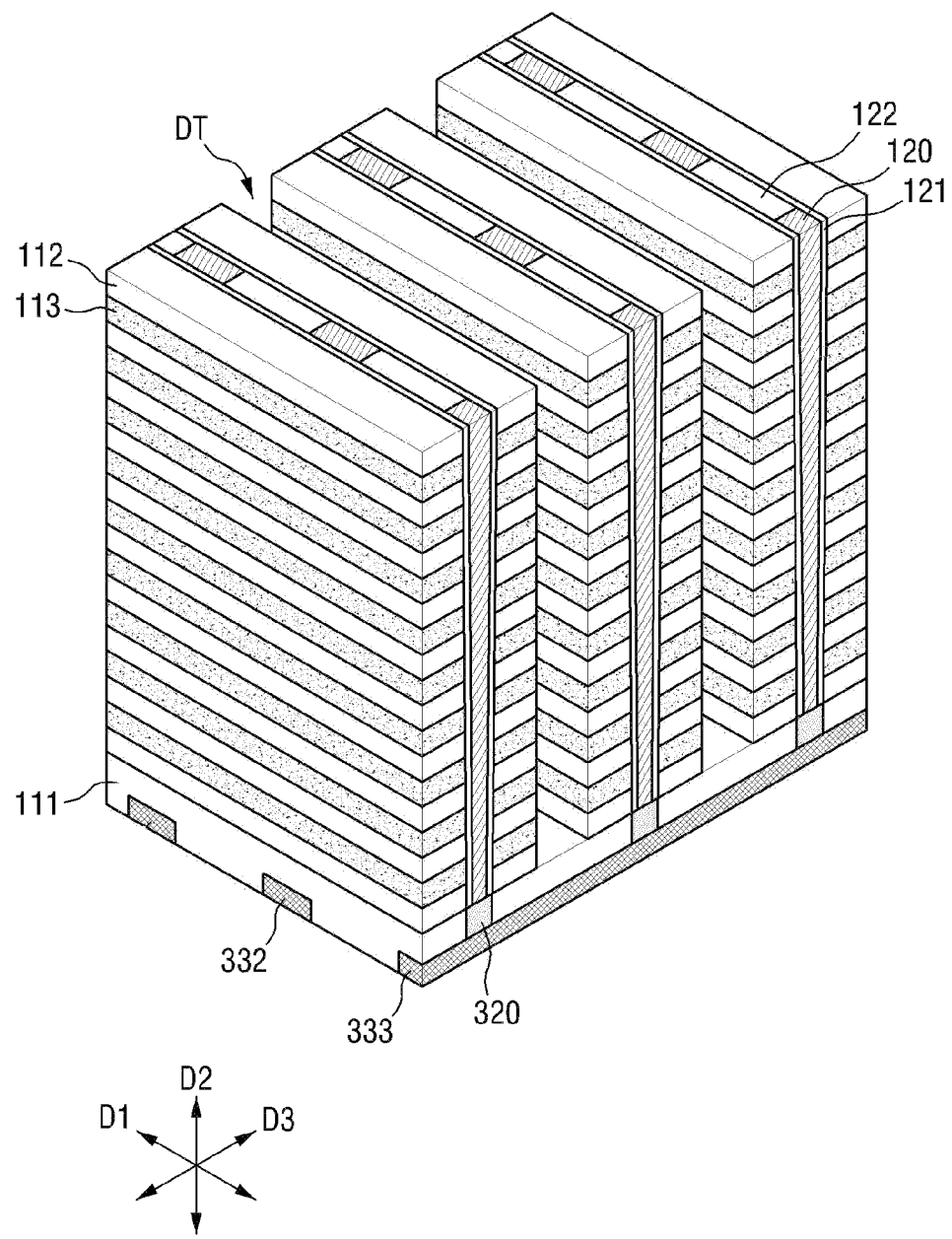

Referring to FIGS. 19 and 24, a plurality of first electrodes 120 may be formed (operation S240). Conductive films (not shown) may be formed in the channel holes CH (see FIG. 23). The conductive films may be planarized to form the first electrodes 120 whose side surfaces may be surrounded by the resistance change films 121 and the isolation insulating films 122. According to some example embodiments, the first electrodes 120 may be formed to contact the bit line contacts 320 exposed by the channel holes CH. Referring to FIGS. 19 and 25, isolation trenches DT which may expose side surfaces of the sacrificial films 113 may be formed by, for example, etching the second interlayer insulating films 112 and the sacrificial films 113 (operation S250).

Figure 26:
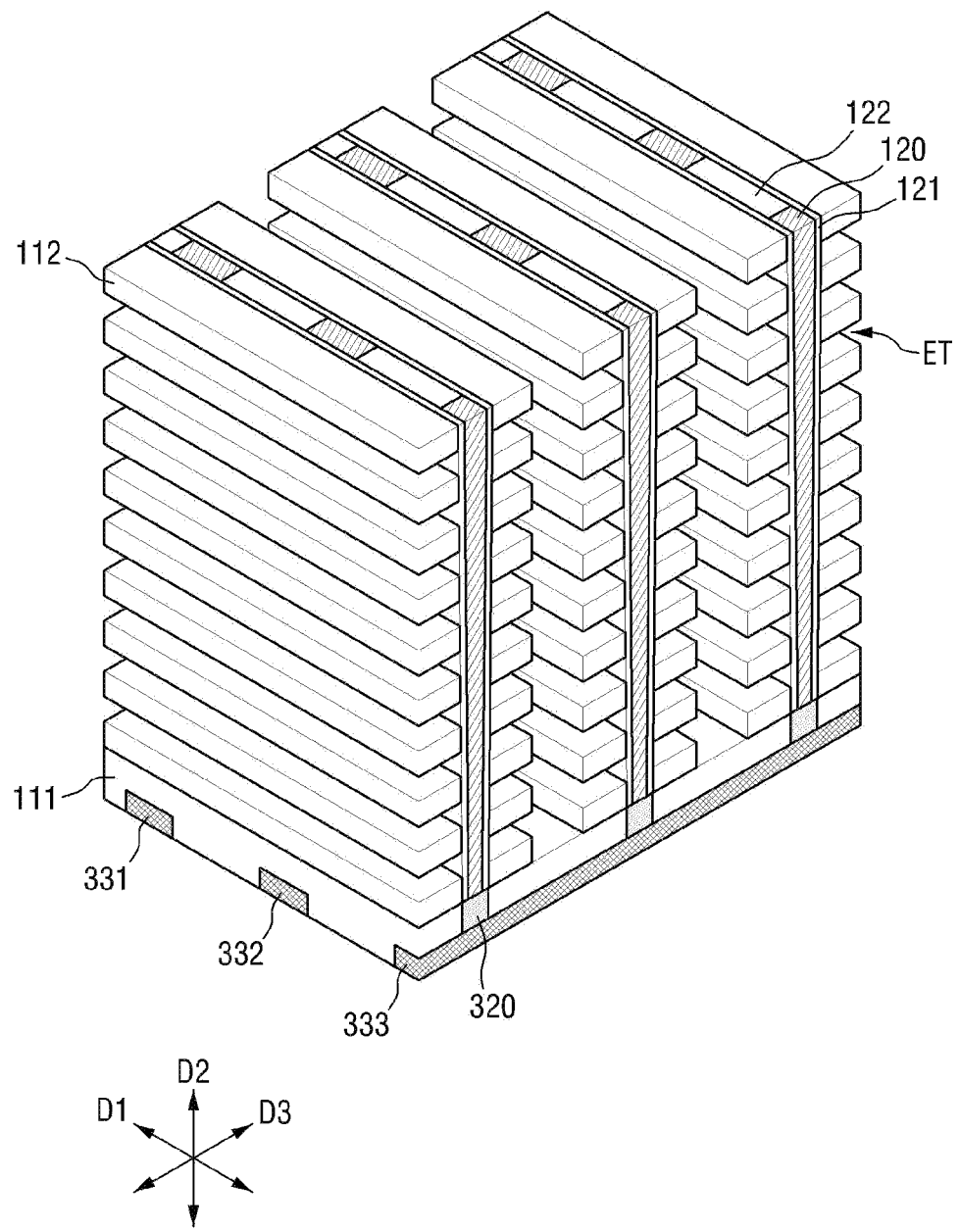
Figure 27:
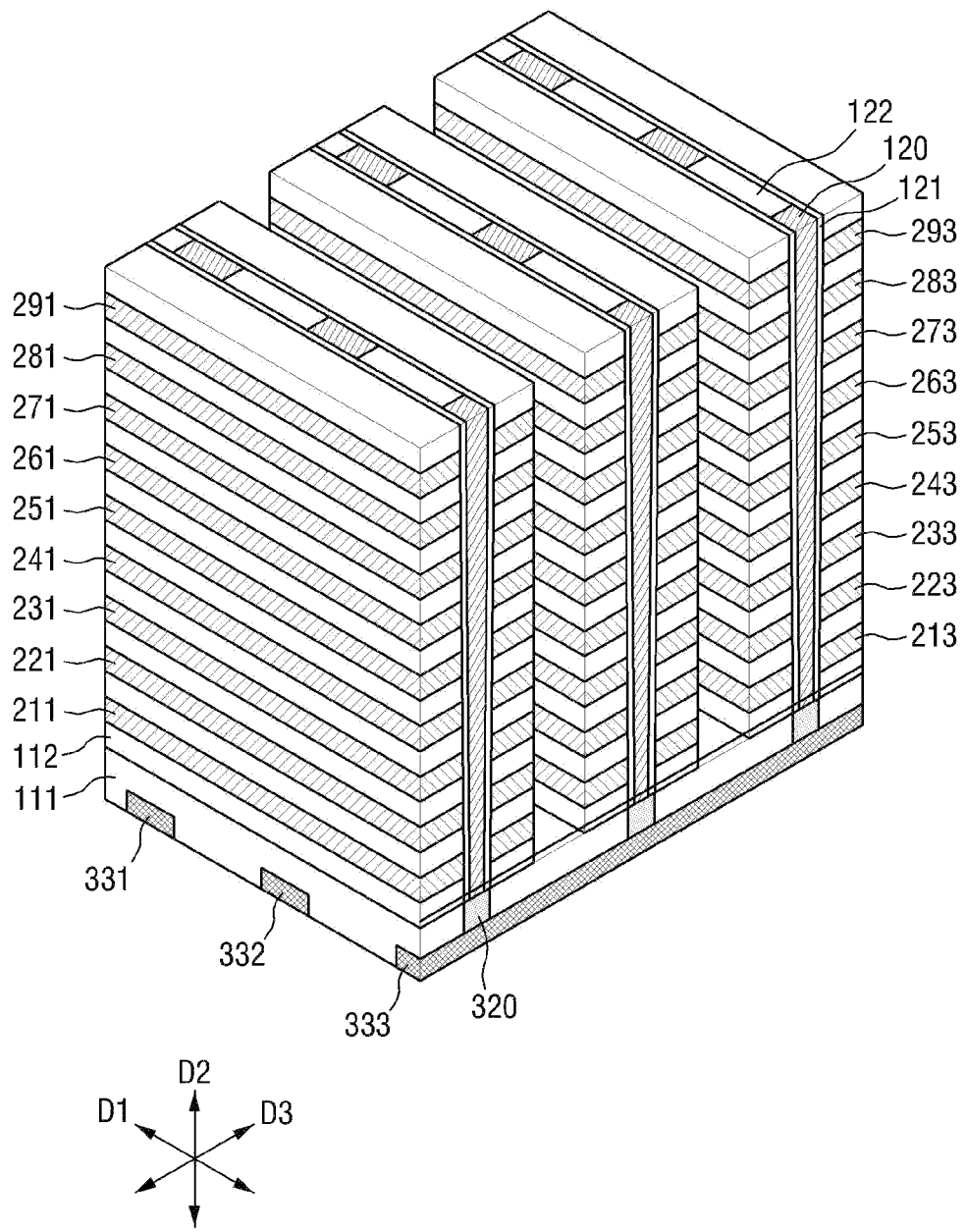

Referring to FIGS. 19 and 26, electrode trenches ET which may expose side surfaces of the resistance change films 121 may be formed by, for example, etching the sacrificial films 113 with the exposed side surfaces (operation S260). Referring to FIGS. 19 and 27, the electrode trenches ET (see FIG. 25) may be filled with conductive films (not shown). The conductive films may be planarized such that nonvolatile memory cells are separated from each other, thereby forming a plurality of second electrodes 211-291, 212-292 and 213-293 (operation S270).

In the nonvolatile memory devices according to the above-described example embodiments, it may be relatively easy to increase the number of nonvolatile memory cells that may be stacked. The integration density of the nonvolatile memory devices may be increased.

Figure 28:
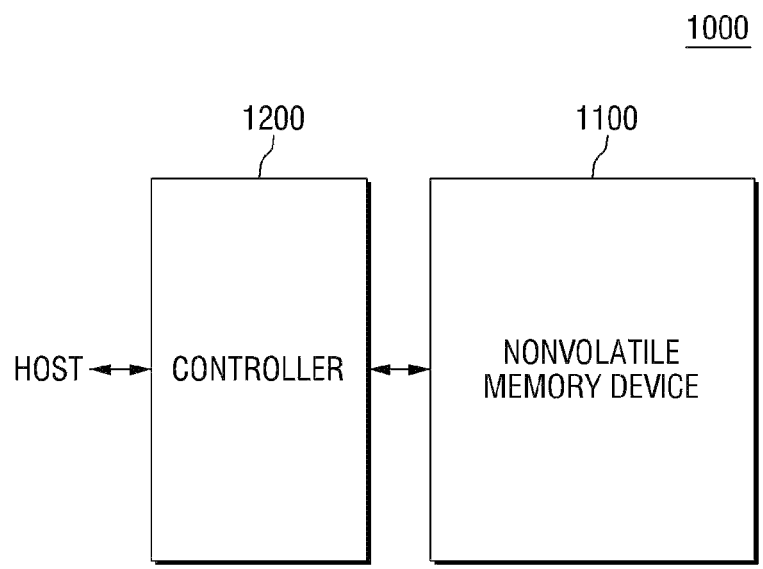
Figure 29:
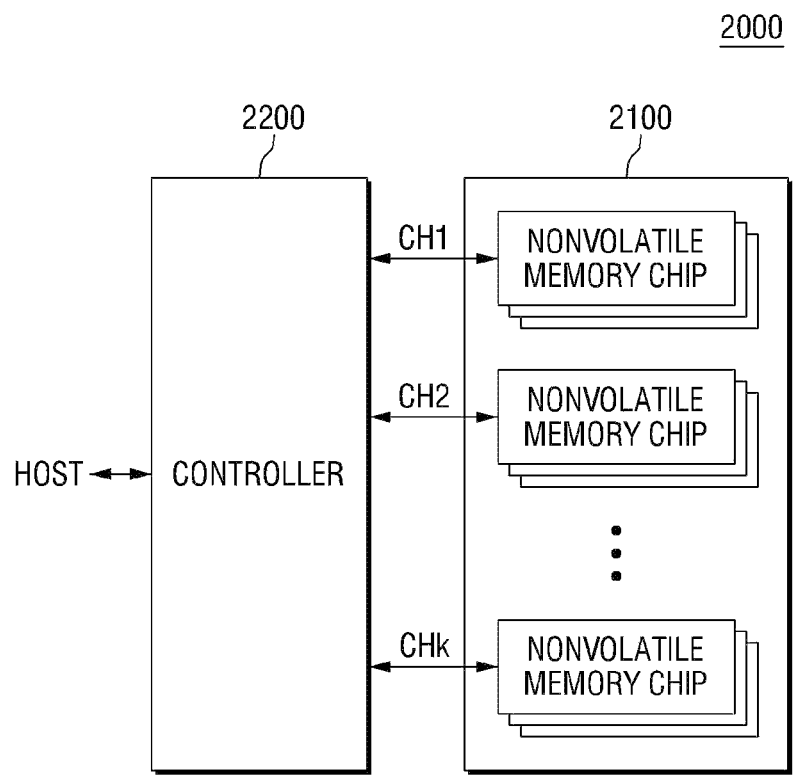
Figure 30:
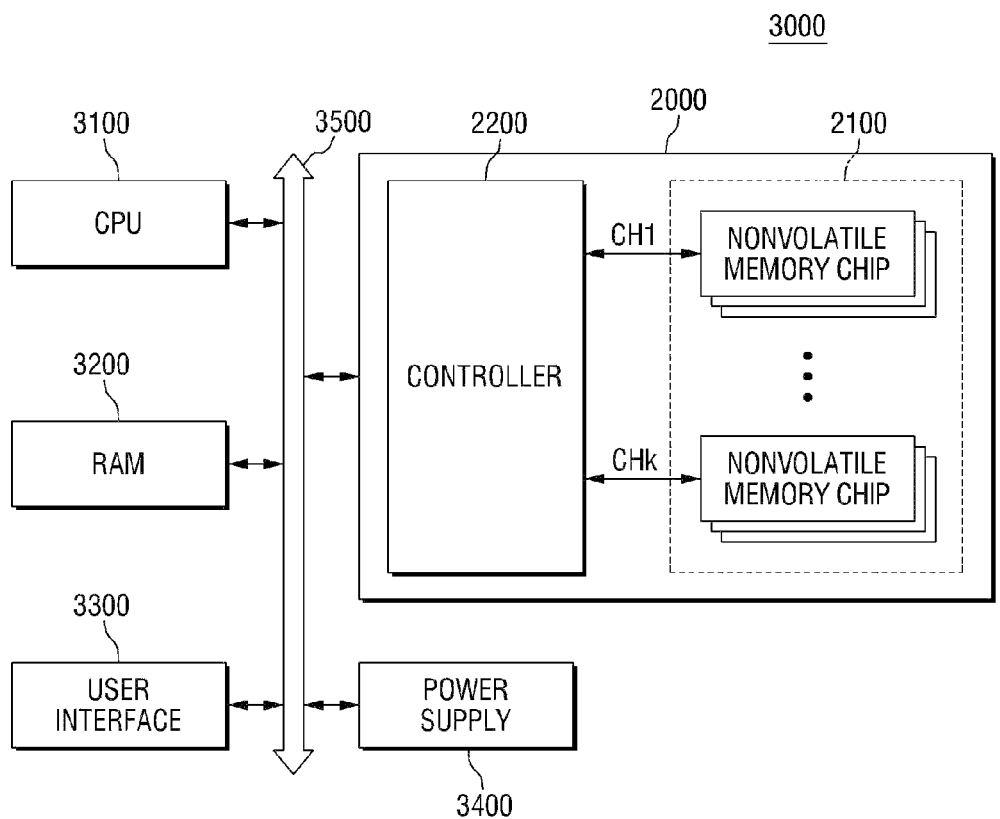

FIG. 28 is a block diagram illustrating memory systems according to some example embodiments. FIG. 29 is a block diagram illustrating application examples of the memory systems of FIG. 28. FIG. 30 is a block diagram illustrating computing systems including memory systems of FIG. 29. Referring to FIG. 28, a memory system 1000 may include a nonvolatile memory device 1100 and a controller 1200. The nonvolatile memory device 1100 may be any one of the nonvolatile memory devices with increased integration density described with respect to FIGS. 1-27. The controller 1200 may be connected to a host HOST and the nonvolatile memory device 1100. The controller 1200 may be configured to access the nonvolatile memory device 1100 in response to a request from the host HOST. For example, the controller 1200 may be configured to control read/write/erase/background operations of the nonvolatile memory device 1100. The controller 1200 may be configured to provide an interface between the nonvolatile memory device 1100 and the host HOST. The controller 1200 may be configured to drive firmware for controlling the nonvolatile memory device 1100.

The controller 1200 may further include well-known components, for example, a random access memory (RAM), a processing unit, a host interface, and/or a memory interface (not illustrated). The RAM may be used as at least one of an operation memory of the processing unit, a cache memory between the nonvolatile memory device 1100 and the host HOST, and a buffer memory between the nonvolatile memory device 1100 and the host HOST. The processing unit may control the overall operation of the controller 1200. The host interface may include a protocol for data exchange between the host HOST and the controller 1200. For example, the controller 1200 may be configured to communicate with an external device (e.g., the host HOST) using at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol.

The memory interface may interface with the nonvolatile memory device 1100. For example, the memory interface may include a NAND interface and/or a NOR interface. The memory system 1000 may include an error correction block (not shown). The error correction block may be configured to detect and correct an error in data read from the nonvolatile memory device 1100 by using an error correction code (ECC). For example, the error correction block may be provided as a component of the controller 1200. The error correction block may also be provided as a component of the nonvolatile memory device 1100.

The controller 1200 and the nonvolatile memory device 1100 may be integrated into one semiconductor device. As an example, the controller 1200 and the nonvolatile memory device 1100 may be integrated into one semiconductor device as all or part of a memory card. For example, the controller 1200 and the nonvolatile memory device 1100 may be integrated into one semiconductor device, for example, as all or part of a personal computer (PC) card (e.g., Personal Computer Memory Card International Association (PCMCIA)), a compact flash card (CF), a smart media card (SM/SMC), a memory stick, a multimedia card (e.g., MMC, RS-MMC and MMCmicro), a SD card (e.g., SD, miniSD, microSD, and SDHC), and/or a universal flash storage (UFS). As another example, the controller 1200 and the nonvolatile memory device 1100 may be integrated into one semiconductor device, for example, into or as a solid state drive (SSD). The SSD may include a storage device which may store data in a semiconductor memory. When the memory system 1000 is used as an SSD, the operation speed of the host that may be connected to the memory system 1000 may increase (e.g., significantly increase).

As another example, the memory system 1000 may be applicable to computers, ultra-mobile PCs (UMPCs), workstations, net-books, personal digital assistants (PDAs), portable computers, web tablets, wireless phones, mobile phones, smart phones, e-books, portable multimedia players (PMPs), portable game devices, navigation devices, black boxes, digital cameras, three-dimensional televisions, digital audio recorders, digital audio players, digital picture recorders, digital picture players, digital video recorders, digital video players, devices capable of transmitting/receiving information in wireless environments, one of various electronic devices constituting a home network, one of various electronic devices constituting a computer network, one of various electronic devices constituting a telematics network, a radio frequency identification (RFID) device, and/or one of various components that may constitute a computing system.

The nonvolatile memory device 1100 and/or the memory system 1000 may be mounted in various types of packages. Examples of packages that may include the nonvolatile memory device 1100 and/or the memory system 1000 include Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), Thin Quad Flat Pack (TQFP), System In Package (SIP), Multi Chip Package (MCP), Wafer-level Fabricated Package (WFP), and/or Wafer-level Processed Stack Package (WSP).

Referring to FIG. 29, a memory device 2000 may include a nonvolatile memory device 2100 and a controller 2200. The nonvolatile memory device 2100 may include a plurality of nonvolatile memory chips. The nonvolatile memory chips may form multiple memory chip groups. Each of the memory chip groups may have a common channel for communication with the controller 2200. For example, it is illustrated in FIG. 24 that the nonvolatile memory chips may communicate with the controller 2200 through first through $k^{th}$ channels CH1-CHk. Each nonvolatile memory chip may be configured in the same way as any one of the nonvolatile memory devices described above with reference to FIGS. 1-27.

In FIG. 29, a plurality of nonvolatile memory chips may be connected to one channel. However, the memory system 2000 may be modified such that one nonvolatile memory chip is connected to one channel, for example.

Referring to FIG. 30, a computing system 3000 may include a central processing unit (CPU) 3100, a RAM 3200, a user interface 3300, a power supply 3400, and a memory system 2000. The memory system 2000 may be electrically connected through a system bus 3500 to the CPU 3100, the RAM 3200, the user interface 3300, and the power supply 3400. Data, which may be provided through the user interface 3300 and/or may be processed by the CPU 3100, may be stored in the memory system 2000.

In FIG. 30, the nonvolatile memory device 2100 may be connected to the system bus 3500 through the controller 2200. However, the nonvolatile memory device 2100 may also be connected directly to the system bus 3500. In FIG. 30, the memory system 2000 described above with reference to FIG. 29 is provided. However, the memory system 2000 may be replaced by the memory system 1000 described above with reference to FIG. 28. The computing system 3000 may also include each of the memory systems 1000 and 2000 described above with reference to FIGS. 28 and 29.

While example embodiments have been particularly shown and described, it will be understood by one of ordinary skill in the art that variations in form and detail may be made therein without departing from the spirit and scope of the claims.

What is claimed is:

1. A nonvolatile memory cell, comprising:
   a bit line, the bit line including a first surface opposite a second surface;
   a first interlayer insulating film;
   a second interlayer insulating film on the first interlayer film;
   a first electrode on the first surface of the bit line, the first electrode electrically connected to the bit line without a switch therebetween, the first electrode penetrating through the first interlayer insulating film and the second interlayer insulating film;
   a second electrode between the first interlayer insulating film and the second interlayer insulating film, the second electrode including a first conductive film and a first diffusion barrier film, the first diffusion barrier film configured as a diffusion barrier to a first conductive material contained in the first conductive film, the first conductive film including a first metal; and
   a resistance change film on a side surface of the first electrode and extending in parallel to the first electrode, the resistance change film directly contacting the side surface of the first electrode and a side surface of the second electrode that faces the side surface of the first electrode; and a bit line contact contacting the first surface of the bit line and a bottom of the first electrode, wherein the bit line contact is on the first surface of the bit line and under the bottom of the first electrode.

2. The nonvolatile memory cell of claim 1, wherein
   the first diffusion barrier film is in contact with the resistance change film, and
   the first conductive film is on the first diffusion barrier film.

3. The nonvolatile memory cell of claim 2, wherein
   the first diffusion barrier film is on a top surface of the first interlayer insulating film, a side surface of the resistance change film, and a bottom surface of the second interlayer insulating film, and
   the first diffusion barrier film surrounds part of the first conductive film.

4. The nonvolatile memory cell of claim 3, wherein side surfaces of the first and second interlayer insulating films, a side surface of the first diffusion barrier film, and a side surface of the first conductive film are aligned with each other.

5. The nonvolatile memory cell of claim 1, wherein
   the first electrode includes a second conductive film, and
   the second conductive film includes a second metal.

6. The nonvolatile memory cell of claim 5, wherein the first electrode includes a second diffusion barrier film configured as a barrier to a second conductive material contained in the second conductive film.

7. The nonvolatile memory cell of claim 6, wherein
   the second diffusion barrier film contacts the resistance change film, and
   the second conductive film is on the second diffusion barrier film.

8. The nonvolatile memory cell of claim 1, wherein the resistance change film includes a transition metal oxide (TMO).

9. The nonvolatile memory cell of claim 8, wherein the TMO includes at least one of hafnium oxide, titanium oxide, tantalum oxide, zinc oxide, niobium oxide, zirconium oxide, nickel oxide, tungsten oxide and aluminum oxide.

10. A nonvolatile memory cell, comprising:
    a bit line, the bit line including a first surface opposite a second surface;
    a first interlayer insulating film;
    a second interlayer insulating film stacked on and separated from the first interlayer insulating film;
    a first electrode on the first surface of the bit line, the first electrode electrically connected to the bit line without a switch therebetween, the first electrode penetrating through the first interlayer insulating film and the second interlayer insulating film;
    a resistance change film directly contacting a side surface of the first electrode and extending in parallel with the first electrode, a material of the resistance change film including an oxygen deficient N-type semiconductor metal oxide;

a second electrode between the first interlayer insulating film and the second interlayer insulating film, the second electrode including a first conductive film and a diffusion barrier, the first conductive film including a metal, and the diffusion barrier being between the first conductive film and the resistance change film, a side surface of the second electrode directly contacting the resistance change film, the side surface of the second electrode facing the side surface of the first electrode; and a bit line contact contacting the first surface of the bit line and a bottom of the first electrode, wherein the bit line contact is on the first surface of the bit line and under the bottom of the first electrode.

11. The nonvolatile memory cell of claim 10, wherein the first electrode includes a second conductive film, and a conductive material of the second conductive film includes a metal.

12. A nonvolatile memory device, comprising:
a plurality of bit lines that each include a first surface opposite a second surface;
a plurality of first interlayer insulating films and a plurality of first electrodes, the plurality of first electrodes alternately stacked with the plurality of the first interlayer insulating films on each of the first surfaces of the plurality of bit lines;
a plurality of second electrodes on each of the first surfaces of the plurality of bit lines, the plurality of second electrodes penetrating through the plurality of first interlayer insulating films and the plurality of first electrodes, at least one of each of the plurality of first electrodes and each of the plurality of second electrodes including a conductive film made of metal, the plurality of second electrodes in a same column being on a same bit line of the plurality of bit lines and electrically connected to the same bit line of the plurality of bit lines without a corresponding switch therebetween;
a plurality of resistance change films on side surfaces of the plurality of second electrodes and directly contacting the plurality of first electrodes and the plurality of second electrodes, the plurality of resistance change films extending in parallel to the plurality of second electrodes, the plurality of resistance change films each including a first surface that is opposite a second surface, the first surface of each of the plurality of resistance change films directly contacting side surfaces of the plurality of first electrodes that face the side surfaces of the plurality of second electrodes, and the second surface of each of the plurality of resistance change films directly contacting one of the plurality of second electrodes; and
a plurality of bit line contacts each contacting the first surface of each of the plurality of bit lines and a bottom of each of the plurality of second electrodes, wherein each of the plurality of bit line contacts are on top of the first surface of the each of the plurality of bit lines and under the bottom of each of the plurality of second electrodes,
wherein the plurality of first electrodes, the plurality of second electrodes and the plurality of resistance change films are part of n nonvolatile memory cells, and
the plurality of resistance change films in each of the n nonvolatile memory cells include a resistance change material, a voltage-current characteristic of the resistance change material including,
a first voltage range in which an inhibit current of about zero flows through the resistance change material and a resistance of the plurality of resistance change films remains unchanged when a first voltage is applied to the resistance change material, the first voltage having a magnitude that ranges from a first inhibit voltage to a second inhibit voltage,
a second voltage range in which a switching current flows through the resistance change material and the resistance of the plurality of resistance change films from a first resistance to a second resistance when a second voltage is applied to the resistance change material, the second voltage having a magnitude that ranges from the magnitude of the first inhibit voltage to a magnitude of a first switching voltage, the magnitude of the first switching voltage being greater than the magnitude of the first inhibit voltage, and
a third voltage range in which the switching current flows through the resistance change material and the resistance of the plurality of resistance change films from the second resistance to the first resistance when a third voltage is applied to the resistance change material, the third voltage having a magnitude that ranges from the magnitude of the second inhibit voltage to a magnitude of a second switching voltage, the magnitude of the second switching voltage being greater than the magnitude of the second inhibit voltage, wherein
each of the n nonvolatile memory cells does not include a diode.

13. The nonvolatile memory device of claim 12, wherein a resistance of the resistance change material in the first voltage range is greater than a maximum resistance of the resistance change material in the second voltage range.

14. The nonvolatile memory device of claim 12, wherein the first resistance of the plurality of resistance change films is different from the second resistance of the plurality of resistance change films.

15. The nonvolatile memory device of claim 12, wherein each of the plurality of resistance change films includes a switchable material.

16. The nonvolatile memory device of claim 15, wherein the switchable material is a non-stoichiometric, oxygen deficient material.

17. The nonvolatile memory device of claim 15, wherein the switchable material is a transition metal oxide.

18. The nonvolatile memory device of claim 15, wherein each of the plurality of second electrodes includes a second metal.

19. The nonvolatile memory device of claim 15, wherein
each of the plurality of first electrodes includes a first diffusion barrier film, and a first metal, and
the first diffusion barrier film is between the first metal and each of the plurality of second electrodes.

20. The nonvolatile memory device of claim 19, wherein
each of the plurality of second electrodes includes a second metal and a second diffusion barrier film, and
the second diffusion barrier film is between the second metal and the switchable material.

21. The nonvolatile memory device of claim 12, wherein each of the second electrodes includes a diffusion barrier film.

22. The nonvolatile memory cell of claim 10, wherein the barrier surrounds a side surface of the first conductive film facing the side surface of the first electrode, surface of the first conductive film, and a bottom surface of the first conductive film.

23. The nonvolatile memory cell of claim 1, wherein
a first portion of the first diffusion barrier film extends between a lower surface of the second interlayer film and an upper surface of the first conductive film, a second portion of the first diffusion barrier film extends between an upper surface of the first interlayer insulating film and a lower surface of the first conductive film, a third portion of the first diffusion barrier film contacts a side surface of the first conductive film, and the resistance change film directly contacts the third portion of the first diffusion barrier film.

24. The nonvolatile memory cell of claim 10, wherein the diffusion barrier extends between a lower surface of the second interlayer film and an upper surface of the conductive film, the diffusion barrier extends between an upper surface of the first interlayer insulating film and a lower surface of the conductive film, a side surface of the diffusion barrier contacts a side surface of the first conductive film, and the resistance change film directly contacts a different surface of the diffusion barrier that is opposite the side surface of the diffusion barrier that contacts the side surface of the first conductive film.

25. The nonvolatile memory cell of claim 12, wherein each one of the plurality of first electrodes includes a conductive film and a diffusion barrier film that wraps around a lower surface, a side surface, and an upper surface of the conductive film, the diffusion barrier film, in each one of the plurality of first electrodes is vertically between two of the plurality of first interlayer insulating films, and each of the plurality of the resistance change films directly contacts a side surface of the diffusion barrier film in each of the plurality of first electrodes.

26. The nonvolatile memory device of claim 12, wherein the plurality of first electrodes each include a diffusion barrier film and a conductive film, the diffusion barrier film includes a first portion on top of an upper surface of the conductive film, a second portion that contacts a side surface of the conductive film, and a third portion, a lower surface of the conductive film is on top of the third portion of the diffusion barrier film, each of the plurality of the resistance change films directly contacts the second portion of the diffusion barrier film.

27. A nonvolatile memory device, comprising:

the nonvolatile memory cell of claim 1, wherein the second electrode is a word line, one end of the resistance change film is electrically connected to the word line and an other end of the resistance change film is electrically connected to the bit line without a switch therebetween, and the nonvolatile memory cell does not include a switch connected to the resistance change film between the word line and the bit line.

28. A nonvolatile memory device, comprising:

the nonvolatile memory cell of claim 10, wherein the second electrode is a word line, one end of the resistance change film is electrically connected to the word line and an other end of the resistance change film is electrically connected to the bit line without a switch therebetween, and the nonvolatile memory cell does not include a switch connected to the resistance change film between the word line and the bit line.

29. The nonvolatile memory cell of claim 1, wherein a combination of the first conductive film and the first diffusion barrier film includes one of W/TiN and Ta/TiN.

30. The nonvolatile memory cell of claim 10, wherein a combination of the first conductive film and the diffusion barrier includes one of W/TiN and Ta/TiN.

31. The nonvolatile memory cell of claim 19, wherein a combination of the first metal and the first diffusion barrier film includes one of W/TiN and Ta/TiN.

* * * * *